US008183670B2

(12) United States Patent
Ohmi et al.

(10) Patent No.: US 8,183,670 B2
(45) Date of Patent: May 22, 2012

(54) SEMICONDUCTOR DEVICE AND METHOD OF MANUFACTURING THE SAME

(75) Inventors: Tadahiro Ohmi, Miyagi (JP); Shigetoshi Sugawa, Miyagi (JP); Akinobu Teramoto, Miyagi (JP); Hiroshi Akahori, Kanagawa (JP); Keiichi Nii, Miyagi (JP)

(73) Assignee: Foundation for Advancement of International Science, Tsukuba (JP)

( * ) Notice: Subject to any disclaimer, the term of this patent is extended or adjusted under 35 U.S.C. 154(b) by 0 days.

(21) Appl. No.: 11/651,034

(22) Filed: Jan. 9, 2007

(65) Prior Publication Data
US 2007/0145535 A1  Jun. 28, 2007

Related U.S. Application Data

(62) Division of application No. 10/725,063, filed on Dec. 2, 2003, now Pat. No. 7,179,746.

(30) Foreign Application Priority Data

Dec. 2, 2002 (JP) .................. 2002/350177
Jul. 31, 2003 (JP) .................. 2003/283560
Sep. 12, 2003 (JP) .................. 2003/322170

(51) Int. Cl.
H01L 29/04 (2006.01)
(52) U.S. Cl. ................ 257/628; 257/E29.004
(58) Field of Classification Search .............. 257/618, 257/627, 628, E29.001, E29.002, E29.003, 257/E29.004
See application file for complete search history.

(56) References Cited

U.S. PATENT DOCUMENTS

| 4,768,076 | A |   | 8/1988  | Aoki et al. |
|-----------|---|---|---------|-------------|
| 5,459,083 | A | * | 10/1995 | Subrahmanyan et al. ..... 438/236 |
| 5,571,373 | A |   | 11/1996 | Krishna et al. |
| 5,676,760 | A |   | 10/1997 | Aoki et al. |
| 5,804,034 | A |   | 9/1998  | Kaeriyama |
| 5,886,389 | A |   | 3/1999  | Niwa |
| 6,020,247 | A | * | 2/2000  | Wilk et al. ..................... 438/398 |

(Continued)

FOREIGN PATENT DOCUMENTS

JP        5-217981        8/1993
(Continued)

OTHER PUBLICATIONS

T. Sato et al., "Roughening of single-crystal silicon surface etched by KOH water," Sensors and Actuators 73 (1999), pp. 122-130.

(Continued)

Primary Examiner — Ha Tran T Nguyen
Assistant Examiner — Kevin Quinto
(74) Attorney, Agent, or Firm — Foley & Lardner LLP

(57) ABSTRACT

In a semiconductor device formed on a silicon surface which has a substantial (110) crystal plane orientation, the silicon surface is flattened so that an arithmetical mean deviation of surface Ra is not greater than 0.15 nm, preferably, 0.09 nm, which enables to manufacture an n-MOS transistor of a high mobility. Such a flattened silicon surface is obtained by repeating a deposition process of a self-sacrifice oxide film in an oxygen radical atmosphere and a removing process of the self-sacrifice oxide film, by cleaning the silicon surface in deaerated $H_2O$ or a low OH density atmosphere, or by strongly terminating the silicon surface by hydrogen or heavy hydrogen. The deposition process of the self-sacrifice oxide film may be carried out by isotropic oxidation.

4 Claims, 16 Drawing Sheets

U.S. PATENT DOCUMENTS

| | | | |
|---|---|---|---|
| 6,066,571 A * | 5/2000 | Usuda et al. | 438/745 |
| 6,189,546 B1 * | 2/2001 | Zhang et al. | 134/1.3 |
| 6,207,509 B1 | 3/2001 | Inoue | |
| 6,258,637 B1 | 7/2001 | Wilk et al. | |
| 6,277,674 B1 * | 8/2001 | Wang et al. | 438/132 |
| 6,300,203 B1 * | 10/2001 | Buynoski et al. | 438/287 |
| 6,325,081 B1 | 12/2001 | Miki et al. | |
| 6,329,268 B1 | 12/2001 | Nakamori et al. | |
| 6,348,157 B1 | 2/2002 | Ohmi et al. | |
| 6,436,801 B1 * | 8/2002 | Wilk et al. | 438/591 |
| 6,483,171 B1 * | 11/2002 | Forbes et al. | 257/627 |
| 6,867,437 B2 | 3/2005 | Takahashi et al. | |
| 6,899,762 B2 | 5/2005 | Wenski et al. | |
| 6,903,393 B2 | 6/2005 | Ohmi et al. | |
| 7,179,746 B2 | 2/2007 | Ohmi et al. | |
| 2002/0014666 A1 * | 2/2002 | Ohmi et al. | 257/368 |
| 2002/0045356 A1 | 4/2002 | Suzuki | |
| 2002/0052096 A1 | 5/2002 | Zhang et al. | |
| 2002/0164883 A1 | 11/2002 | Ohmi et al. | |
| 2003/0082923 A1 | 5/2003 | Ono | |
| 2004/0045580 A1 * | 3/2004 | Kurita et al. | 134/3 |
| 2009/0023231 A1 | 1/2009 | Ohmi et al. | |
| 2010/0072519 A1 * | 3/2010 | Ohmi et al. | 257/255 |

FOREIGN PATENT DOCUMENTS

| | | |
|---|---|---|
| JP | 6-244174 | 9/1994 |
| JP | 07-142438 | 6/1995 |
| JP | 07-263430 | 10/1995 |
| JP | 7-302775 | 11/1995 |
| JP | 9-051097 A | 2/1997 |
| JP | 10-209446 | 8/1998 |
| JP | 10-229064 | 8/1998 |
| JP | 10-335289 | 12/1998 |
| JP | 10-335289 A | 12/1998 |
| JP | 11-057636 | 3/1999 |
| JP | 11-057636 A | 3/1999 |
| JP | 11-060377 | 3/1999 |
| JP | 11-102906 | 4/1999 |
| JP | 11-162876 | 6/1999 |
| JP | 11-204492 | 7/1999 |
| JP | 11-251599 | 9/1999 |
| JP | 2000-260767 | 9/2000 |
| JP | 2001-135805 | 5/2001 |
| JP | 2001-185485 | 7/2001 |
| JP | 2001-308341 | 11/2001 |
| JP | 2002-050605 A | 2/2002 |
| JP | 2002-184973 | 6/2002 |
| JP | 2002-289611 | 10/2002 |
| JP | 2003-115587 | 4/2003 |
| JP | 2003-142469 | 5/2003 |
| JP | 2004-146583 | 5/2004 |
| JP | 2004-200672 | 7/2004 |
| KR | 1998-018344 | 6/1998 |
| KR | 2000-0011820 | 2/2000 |
| KR | 2001-0021223 | 3/2001 |
| TW | 277143 | 6/1996 |
| WO | WO 98/01896 | 1/1998 |
| WO | WO 98/33362 A1 | 7/1998 |

OTHER PUBLICATIONS

T. Sato et al., Phys. Rev., Br, 1950 (1971) 1 pg.

Meuris et al., "The Relationship of the Silicon Surface Roughness and Gate Oxide Integrity in NH4OH/H2O2 Mixtures", Japanese Journal of Applied Physics, vol. 31:11A, Part 2, Nov. 1992, XP000414884.

Miyashita et al., "Dependence of Thin Oxide Films Quality on Surface Micro-Roughness," 1991 Symposium on VLSI Technology, May 28-30, 1991, Oiso, Japan, XP010296557.

Kern, Overview and Evolution of Semiconductor Wafer Contamination and Cleaning Technology, pp. 1-66.

Korean Patent Office official action on application No. 10-2003-0086812 dated Jun. 10, 2011; pp. 1-5.

Japanese Patent Office office action on application No. 2003-322170 dated Jan. 19, 2011; 6 pages.

* cited by examiner

US 8,183,670 B2

SEMICONDUCTOR DEVICE AND METHOD OF MANUFACTURING THE SAME

CROSS-REFERENCE TO RELATED PATENT APPLICATIONS

This application is a division of application Ser. No. 10/725,063, filed Dec. 2, 2003, now pending, which claims priority from Japanese Patent Applications Nos. 2002-350177, filed Dec. 2, 2002; 2003-283560, filed Jul. 31, 2003; and 2003-322170, filed Sep. 12, 2003, by Tadahiro Ohmi, Shigetoshi Sugawa, Akinobu Teramoto, Hiroshi Akahori and Keiichi Nii, all of which are incorporated herein by reference in their entirety. This application claims only subject matter disclosed in the parent application and therefore presents no new matter.

BACKGROUND OF THE INVENTION

This invention relates to a semiconductor device, a method of manufacturing the same, and a method of processing a semiconductor surface.

Among various semiconductor devices, there is a field effect transistor that will be mainly considered as a metal-insulator-semiconductor (MIS) transistor or a metal-oxide-semiconductor (MOS) in the instant specification and that has a source region, a drain region, and a channel region along a semiconductor surface. In this connection, the following description will be mainly made about the MOS transistor, which is a representative MIS transistor. As well known in the art, such an MOS transistor is classified into an n-type field effect transistor (will be simply called an n-type transistor) and a p-type field effect transistor (will be simply called a p-type transistor).

It often happens that both the n-type transistor and the p-type transistor are integrated in a single chip as a large scale integrated (LSI) circuit. In this event, each transistor is formed on a silicon substance, such as a silicon substrate, a silicon film and the silicon substance usually has a surface with a (100) crystal plane orientation. Such silicon substance and such a surface with the (100) crystal plane orientation may be referred to as a (100) silicon substance (or simply a (100) silicon) and a (100) surface, respectively.

It is to be noted throughout the instant specification that the (100) surface with the (100) crystal plane orientation collectively implies not only (100) surface but also its equivalent surfaces, such as (010), (001), and so on.

Herein, when the n-type transistor and the p-type transistor are manufactured by the use of the (100) silicon substance, it is known in the art that the p-type transistor is as low as about 30% of the n-type transistor in performance (or drivability), such as mobility. Taking this into consideration, it is usual that the p-type transistor is designed so that it becomes large in size as compared with the n-type transistor. However, such designing becomes a bar to miniaturization of a semiconductor device.

Referring to FIG. 1, description will be made for a better understanding of this invention about a conventional method for manufacturing a semiconductor device. In the illustrated example, an n-type transistor of a lightly doped drain (LDD) structure is formed in a semiconductor region.

In FIG. 1 (a), a p-type silicon substance 101 is prepared which has a (100) surface with a (100) crystal plane orientation and which may be simply called a p-type (100) silicon substance. As shown in FIG. 1 (a), the p-type (100) silicon substance is subjected to a shallow trench isolation (STI) method to isolate element or device regions from others. As a result, the device region is defined or partitioned into the (100) surface of the p-type (100) silicon substance. The silicon substance may be, for example, a semiconductor substrate, a semiconductor layer or film on the semiconductor substrate, as mentioned before.

Next, the (100) surface of the p-type (100) silicon substance, especially, the device region 102 is subjected to RCA cleaning by the use of $NH_4OH$—$H_2O_2$—$H_2O$ (SC1) and HCl—$H_2O_2$—$H_2O$(SC2), as shown in FIG. 1 (b). As the result of the RCA cleaning, organic matters, particles and impurity metals are removed from a whole surface. Subsequently, a gate insulation film ($SiO_2$) 103 are formed on the surface (FIG. 1 (c)).

As shown in FIG. 1 (d), boron (B) is ion-implanted on the whole surface of the silicon substance 101 and ion-implanted boron serves to control a threshold voltage. After the ion implantation, a poly-crystalline silicon (poly-silicon) film is deposited on the whole surface of the silicon substance 101 and is patterned to leave a poly-crystalline silicon electrode 105 on the gate insulation film 103 of the device region 102, as illustrated in FIG. 1 (e).

Subsequently, phosphorus of a low density is ion-implanted, as shown in FIG. 1 (f), to form source and drain regions 106 of an n-type, both of which are effective to mitigate a high electric field. Thereafter, a silicon oxide film ($SiO_2$) is deposited by a CVD method or the like on both the surface of the silicon substance 101 and on the gate electrode 105 and is selectively etched by anisotropic etching to leave a side wall insulation film 107 on a side wall of the gate electrode 105, as illustrated in FIG. 1 (g).

Under the circumstances, ion implantation of an n-type impurity, such as arsenic, is carried out with a high density to form source and drain regions 108 of n+ type, as shown in FIG. 1 (h). Thus, the n-type transistor is manufactured by using the p type (100) silicon substance.

A p-type transistor can be manufactured in a manner similar to the n-type transistor by the use of a (100) silicon substance, although not shown in FIG. 1. However, it is to be noted that the p-type transistor is inferior to the n-type transistor in mobility when the n-type and the p-type transistors are manufactured by the use of the (100) silicon substance.

In order to enhance the mobility of the p-type transistor, a proposal has been made about using a (110) silicon substance which has a (110) surface with a (110) crystal plane orientation. Practically, it has been reported that using the (110) silicon substance makes it possible to raise up the mobility of the p-type transistor to about 2.5 times in comparison with the case where the (100) silicon substance is used. However, it has been pointed out also that using the (110) silicon substance brings about reducing the mobility of the n-type transistor by a factor of about 0.6 in comparison with the case where the (100) silicon substance is used.

Under the circumstances, it has been considered that the (110) silicon substance becomes a very efficient material, if it is possible to suppress the reduction of the mobility in the n-type transistor.

Neither suggestion nor proposal has been made at all at the present about a method of avoiding a reduction of the mobility in the n-type transistor formed by the (110) silicon substance.

Various apparatus and methods that might be applied to the (110) silicon substance are disclosed in International Patent Publication No. WO98/33362 (will be called Reference 1) and Japanese Unexamined Publication No. Hei 11-57636 (will be called Reference 2). However, experiments of Reference 1 have been made only about (100) silicon substance but never made about (110) silicon substance. Likewise, Reference 2 has investigated only a (100) silicon substance and never considers a (110) silicon substance.

On the other hand, disclosure is made in Japanese Patent Unexamined Publication No. Hei 9-51097 (Reference 3) about a method of manufacturing a field effect transistor. The method is effective to avoid a degradation of a boundary or interface mobility, which might be caused to occur due to electron scattering on an interface between a silicon surface and an oxide film. However, no investigation is made in Reference 3 at all about (110) silicon substance, although Reference 3 teaches about making a running direction of electrons in the (100) silicon substance parallel with a direction of a step.

According to inventors' studies, it has been found out that, when a field effect transistor is manufactured by the method illustrated in FIG. 1, a surface of the device region is inevitably roughened during an alkali processing step in the RCA cleaning, a rinsing step by pure water, and the like.

Herein, a mobility of a carrier in a field effect transistor is one of factors showing the drivability of the transistor. As well known in the art, a hole is the carrier in the p-type field effect transistor while an electron is the carrier in the n-type transistor. In general, it is necessary to raise up a mobility of a carrier by lessening a surface roughness of the element region so as to improve the drivability of the field effect transistor.

Specifically, it has been found out by the inventors that using usual RCA cleaning brings about roughening the element region of the silicon substance to a surface roughness Ra=0.5 to 1.5 nm, where Ra is representative of an arithmetical mean deviation of surface (i.e., a center line average roughness) and that the gate insulation film is deposited on such a roughened surface.

In addition, the gate insulation film is often a silicon dioxide film that is deposited by using dry $O_2$. In this event, it has been observed that a boundary between the silicon surface and the gate insulation film of $SiO_2$ is further roughened. This would result from the fact that, when the dry $O_2$ is used for oxidation, species or seeds for oxidation are invaded from (111) facets and oxidation preferentially proceeds along the facets.

Moreover, when a field effect transistor is manufactured by the use of a silicon substance that is roughened by the RCA cleaning, a drivability of the field effect transistor is reduced. In addition, when an electric voltage is applied on the gate electrode, an electric field is eccentrically concentrated on minute projections and such concentration of the electric field is liable to bring about breakdown of the gate insulation film.

Especially, when the silicon substance which has a surface (110) with the (110) crystal plane orientation or its equivalents is cleaned by the RCA cleaning, it has been found out that the (110) surface is greatly roughened, which results in a reduction of the mobility when the field effect transistor is manufactured. Although the above-mentioned description has been restricted to the n-type transistor, this applies to any other semiconductor devices, such as TFT, CCD, IGBT, and the like.

SUMMARY OF THE INVENTION

It is an object of this invention to provide a semiconductor device which has an improved characteristic or performance.

It is another object of this invention to provide a semiconductor device of the type described, which can improve the characteristic by flattening a surface of a silicon substance.

It is still another object of this invention to provide a semiconductor device, which is structured by a silicon substance which has a (110) surface with a (110) crystal plane orientation and an improved characteristic.

It is yet another object of this invention to provide a method of manufacturing a semiconductor device (especially, an n-type transistor) with a high drivability by using a silicon substance which has a (110) surface with the (110) crystal plane orientation.

It is another object of this invention to provide a method which can make a surface roughness of a semiconductor region flat.

It is another object of this invention to provide a method which can flatten or keep a surface roughness of a semiconductor surface subjected to cleaning.

According to an aspect of this invention, a semiconductor device has a silicon surface of a predetermined crystal plane orientation. The silicon surface has a prescribed arithmetical mean deviation of surface Ra that is not greater than 0.09 nm. In this event, the predetermined crystal plane orientation may include a substantial (100) crystal plane orientation.

According to another aspect of this invention, the predetermined crystal plane orientation includes a substantial (100) crystal plane orientation.

According to still another aspect of this invention, a semiconductor device has a silicon surface with a (110) crystal plane orientation. The silicon surface has a prescribed arithmetical mean deviation of surface Ra that is not greater than 0.15 nm.

Preferably, the prescribed arithmetical mean deviation of surface of the silicon surface roughness Ra is not greater than 0.11 nm and more preferably is not greater than 0.09 nm.

More preferably, the prescribed arithmetical mean deviation of surface Ra is not greater than 0.07 nm or is not greater than 0.02 nm.

At any rate, the (110) crystal plane orientation is selected from a group consisting of (110), (551), (311), (221), (553), (335), (112), (113), (115), (117), (331), (221), (332), (111), and (320) crystal plane orientations.

Preferably, the surface of the (110) crystal plane orientation is specified by either (110) or (551) crystal plane orientation.

According to another aspect of this invention, a semiconductor device comprises a field effect transistor having a source region, a drain region, a channel region, a gate insulation film on the channel region, and a gate electrode on the gate insulation film. The channel region is formed at a semiconductor silicon surface which has a predetermined crystal plane orientation. The silicon surface having a prescribed arithmetical mean deviation of surface Ra that is not greater than 0.09 nm.

The predetermined crystal plane orientation may include a substantial (100) crystal plane orientation.

According to still another aspect of this invention, a semiconductor device comprises a field effect transistor having a source region, a drain region, a channel region, a gate insulation film on the channel region, and a gate electrode on the gate insulation film. The channel region is formed at a semiconductor silicon surface which has a (110) crystal plane orientation. The silicon surface has a prescribed arithmetical mean deviation of surface Ra that is not greater than 0.15 nm.

The prescribed arithmetical mean deviation of surface of the silicon surface roughness Ra may be not greater than 0.11 nm. Preferably, the prescribed arithmetical mean deviation of surface Ra is not greater than 0.07 nm.

Specifically, the (110) crystal plane orientation is selected from a group consisting of (110), (551), (311), (221), (553), (335), (112), (113), (115), (117), (331), (221), (332), (111)

and (320) crystal plane orientations. Preferably, the silicon surface has either (110) or (551) crystal plane orientation.

In this event, the gate insulation film may comprise at least one selected from a group consisting of a silicon oxide film, a silicon nitride film and a silicon oxynitride film.

The gate insulation film may contain therein a rare gas element.

Specifically, the gate insulation film of the field effect transistor includes a dielectric film of a high specific dielectric constant and/or the dielectric film may include at least one material selected from a group consisting of metal silicate, metal oxide and metal nitride. The metal silicate consists of Si and at least one selected from a group consisting of Hf, Zr, Ta, Ti, La, Co, Y and Al. On the other hand, the metal oxide consists of at least one selected from a group consisting of oxides of Si, Hf, Zr, Ta, Ti, Y, Nb, Na, Co, Al, Zn, Pb, Mg, Bi, La, Ce, Pr, Sm, Eu, Gd, Dy, Er, Sr and Ba.

The above-mentioned metal nitride consists of N and at least one selected from a group consisting of Si, Hf, Zr, Ta, Ti, Y, Nb, Na, Co, Al, Zn, Pb, Mg, Bi, La, Ce, Pr, Sm, Eu, Gd, Dy, Er, Sr and Ba.

Alternatively, the gate insulation film may comprise a combination of films selected from a silicon oxide film, a silicon nitride film, a silicon oxynitride film and a dielectric film of a high specific dielectric constant.

According to a specific aspect of this invention, a method is for use in manufacturing a semiconductor device. The method comprises the steps of preparing a silicon semiconductor surface which has a predetermined crystal plane orientation and flattening the semiconductor surface to accomplish a prescribed arithmetical mean deviation of surface Ra which is not greater than 0.09 nm.

The predetermined crystal plane orientation may include a substantial (100) crystal plane orientation.

According to another specific aspect of this invention, a method is for use in manufacturing a semiconductor device. The method comprises the steps of preparing a silicon semiconductor surface which has a (110) crystal plane orientation and flattening the silicon surface to accomplish a prescribed arithmetical mean deviation of surface Ra which is not greater than 0.15 nm.

Specifically, the flattening step comprises the steps of cleaning the silicon surface with an RCA SC1 cleaning liquid with a reduced OH concentration and forming an oxide film on the cleaned surface by oxidizing the cleaned silicon surface in an atmosphere containing oxygen radicals.

Alternatively, the flattening step may comprise the steps of isotropically oxidizing the silicon surface to form a first oxide film on the silicon surface to flatten the silicon surface into the prescribed arithmetical mean deviation of surface Ra and removing the first oxide film. In this event, the isotropically oxidizing step and the removing step are repeated a plurality of times until the prescribed arithmetical mean deviation of surface Ra is achieved.

According to another aspect of this invention, the oxide film is used as a gate insulation layer or as a portion of a gate insulation layer. The method further comprises the step of forming a gate electrode on said gate insulation layer.

The above-mentioned method may further comprise the steps of forming a gate insulation layer on the flattened silicon surface and forming a gate electrode on said gate insulation layer.

The isotropically oxidizing step mentioned above may comprise the step of carrying out radical oxidation of the silicon surface at a temperature not higher than 550° C.

Alternatively, the isotropically oxidizing step is carried out by contacting the silicon surface with ozone water. In this case, the ozone water is ultra-pure water with 0.001 ppm to 100 ppm of ozone being dissolved therein. The ozone may be included within a range between 1 ppm and 30 ppm in the ultra-pure water.

In addition, the isotropically oxidizing step may be carried out by contacting the silicon surface with hydrogen peroxide solution. The hydrogen peroxide solution includes, by weight, 30 to 100% of hydrogen peroxide.

Furthermore, the isotropically oxidizing step may be carried out for more than 10 seconds at a temperature between 10 and 30° C.

The above-mentioned removing step may be carried out by the use of a solution including hydrogen fluoride (HF). The solution is preferably a mixed solution of HF and HCl.

The solution may include HF and $H_2O$ with dissolved oxygen of less than 100 ppb.

At any rate, the above-mentioned (110) crystal plane orientation includes (110), (551), (311), (221), (553), (335), (112), (113), (115), (117), (331), (221), (332), (111) and (320) crystal plane orientations.

The above-mentioned flattening step is preferably carried out without exposing the silicon surface to an air.

According to another specific aspect of this invention, the step of forming the oxide film is performed by using gas plasma generated in a mixed gas of a rare gas selected from at least one of argon, krypton and xenon and an oxygen gas by microwave excitation.

According to still another specific aspect of this invention, the step of carrying out radical oxidation is performed by using gas plasma generated in a mixed gas of a rare gas selected from at least one of argon, krypton and xenon and an oxygen gas by microwave excitation.

According to another aspect of this invention, the flattening step includes oxidizing the silicon surface by using gas plasma generated in a mixed gas of a rare gas selected from at least one of argon, krypton and xenon and an oxygen gas by microwave excitation.

The prescribed arithmetical mean deviation of surface is preferably not greater than 0.09 nm.

According to still another aspect of this invention, the method may further comprise the step of forming a gate insulation film on the silicon surface. The gate insulation film forming step includes a selected one of the steps of:

carrying out an oxidation process of the silicon surface in an atmosphere which includes radical oxygen;

processing the silicon surface in an atmosphere which includes radical nitrogen or radical $NH_4$; and processing the silicon surface in the atmosphere which includes radical oxygen and at least one of radical nitrogen and radical $NH_4$.

The gate insulation film forming step may comprise the steps of:

preparing a mixed gas of a rare gas selected from at least one of argon, krypton and xenon and an insulation film forming gas selected from at least one of ammonia, oxygen, nitrogen, NO and $N_2O$; and generating plasma in the mixed gas by microwave excitation to form the gate insulation film.

According to yet another aspect of this invention, the flattening step comprises a first step of forming, on the silicon surface, an oxide film by carrying out oxidation process by the use of $H_2O$ vapor, a second step of removing a portion of the entire thickness of the oxide film to leave a thickness between 10 angstroms and 1000 angstroms of the oxide film on the silicon surface, the first and the second steps being performed at least once, respectively, and a third step of completely removing the oxide film by an aqueous solution including HF.

According to still another aspect of this invention, the flattening step comprises a cleaning step of cleaning the silicon surface. In this case, the cleaning step comprises the step of cleaning the silicon surface in accordance with the RCA cleaning procedure wherein an OH concentration is reduced.

Alternatively, the cleaning step comprises the step of cleaning the silicon surface with cleaning liquid having a pH value of not more than 7.

Furthermore, the cleaning step may comprise a first step of rinsing the silicon surface by using pure water including ozone, a second step of cleaning the silicon surface by the use of a cleaning solution which includes HF, $H_2O$ with dissolved oxygen reduced, and surface-active agent, providing a vibration of a frequency not lower than 500 kHz, a third step of rinsing the silicon surface by the use of $H_2O$ including ozone, a fourth step of cleaning the silicon surface by the use of a cleaning solution including HF and $H_2O$ with dissolved oxygen reduced so as to remove an oxide film, and a fifth step of rinsing the silicon surface by the use of hydrogen-added $H_2O$.

In this case, hydrogen may be added to the cleaning solution of at least one of the second step and the fourth step.

According to another aspect of this invention, the cleaning step may include processing the silicon surface by the use of a cleaning solution containing HF and $H_2O$ with dissolved oxygen of less than 100 ppb.

The cleaning step may also comprise the steps of preparing a cleaning solution which includes HF, $H_2O$ with dissolved oxygen of less than 100 ppb and hydrogen of 0.1 ppm to 1.6 ppm and providing the cleaning solution with a vibration of a frequency not lower than 500 kHz.

The cleaning step may be carried out without exposing the silicon surface to an air.

The cleaning step may also be carried out by contacting the silicon surface with cleaning liquid with applying ultrasonic vibration to the cleaning liquid while generation of OH in the cleaning liquid is suppressed.

According to an aspect of this invention, a method is for use in manufacturing a semiconductor device and comprises the steps of preparing a silicon semiconductor surface which has a predetermined crystal plane orientation and rinsing the silicon surface by the use of $H_2O$ added with hydrogen or deuterium and by applying high frequency vibration to said $H_2O$ to terminate silicon at the silicon surface by hydrogen or deuterium, respectively. The high frequency is not less than 500 kHz and the concentration of said hydrogen or deuterium in said $H_2O$ is 0.1 ppm to 1.6 ppm.

The flattening step comprises the step of rinsing the silicon surface by the use of $H_2O$ added with hydrogen or deuterium and by applying high frequency vibration to said $H_2O$ to terminate silicon at the silicon surface by hydrogen or deuterium, respectively. The rinsing step may comprise one of the steps of dipping or immersing the silicon surface into the $H_2O$ added with hydrogen or deuterium and spraying, onto the silicon surface, $H_2O$ added with hydrogen or deuterium. In this event, the high frequency is not less than 500 kHz and the concentration of said hydrogen or deuterium in said $H_2O$ is 0.1 ppm to 1.6 ppm.

The above-mentioned flattening step may comprise a first step of cleaning the silicon surface by the use of $H_2O$ including ozone, a second step of carrying out cleaning by a cleaning solution including HF, $H_2O$ and a surface-active agent, providing vibrations of a frequency not lower than 500 kHz, a third step of carrying out cleaning by $H_2O$ including ozone, a fourth step of carrying out cleaning to remove an oxide film by the use of a cleaning solution including HF and $H_2O$, and a fifth step of carrying out cleaning by using hydrogen or deuterium-added $H_2O$, providing vibrations of a frequency not lower than 500 kHz, so as to terminate the silicon surface by hydrogen or deuterium, respectively.

In the above second and fourth steps, oxygen is removed from the $H_2O$ and hydrogen is added thereto.

The rinsing step may be carried out with the silicon surface being kept isolated from the air.

Furthermore, the first to fifth steps may be carried out with the silicon surface being kept not exposed to the air.

On the other hand, the rinsing step may be carried out in an atmosphere of nitrogen, hydrogen, deuterium or mixture of hydrogen and deuterium.

The silicon surface preferably has a (110) crystal plane orientation.

DETAILED DESCRIPTION OF THE PREFERRED EMBODIMENTS

First Embodiment

Figure 3:
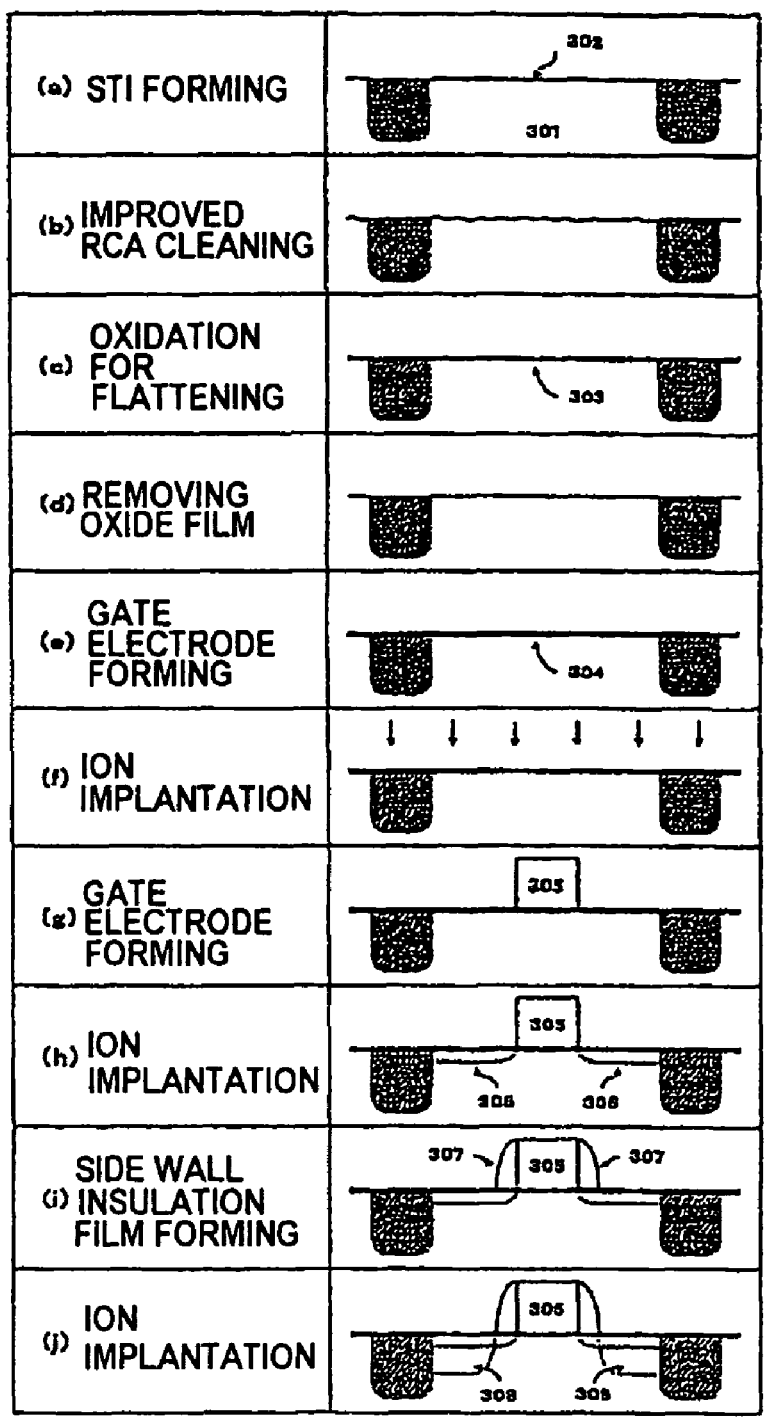
FIG. 3 shows a method of manufacturing a semiconductor device according to a first embodiment of this invention in the process order.

Referring to FIG. 3, a method according to a first embodiment of this invention will be described and will be used to manufacture a semiconductor device. At first, a p-type (110) silicon substance (simply called silicon substance) 301 is prepared which has a (110) surface with a (110) crystal plane orientation and which is subjected to isolation to define an element region or a device region 302, as shown in FIG. 3 (a). The device region serves to form source, drain, and channel regions.

Subsequently, the silicon substance is subjected to RCA cleaning procedure to remove organic matters, particles, and metals from the device region 302, as illustrated in FIG. 3 (b). As known in the art, the RCA cleaning procedure may involve RCA Standard-Clean-1 (abbreviated to SC1) procedure and RCA Standard-Clean-2 (abbreviated to SC2) procedure. Specifically, the SC1 procedure uses a mixture of hydrogen peroxide, ammonium hydroxide, and water heated to a temperature of about 70° C. while the SC2 procedure uses a mixture of hydrogen peroxide, hydrochloric acid, and water heated to a temperature of about 70° C. The SC1 procedure is effective to dissolve films and to remove Group I (particles) and Group II (organic substances) while the SC2 procedure is effective to remove metals that are not removed by the SC1 procedure.

In FIG. 3 (b), the SC1 is used to clean the silicon substance 301. In this case, it has been found out that the silicon substance 301 is microscopically roughened during the SC1 procedure. In other words, a surface roughness of the silicon substance 301 is minutely increased even by the SC1 procedure for cleaning the surface of the silicon substance 301. Practically, it has been confirmed that the surface of the silicon substance 301 is etched during the SC1 procedure in dependency upon a concentration of OH and, as a result, shows an increased roughness.

Under the circumstances, the SC1 procedure is carried out with the concentration of OH lowered. Although the mixed solution is usually used in a conventional SC1 procedure such that a mixed ratio of $NH_4OH:H_2O_2:H_2O$ is equal to 1:1:5, a mixed solution is used in the SC1 procedure illustrated in FIG. 3 (b) such that a mixed ratio of $NH_4OH:H_2O_2:H_2O$ becomes equal to 0.05:1:5. This shows that the mixed solution in FIG. 3 (b) is lowered in a concentration of OH as compared with that used in the conventional SC1 procedure.

In addition, when the silicon substance has a high density of defects, such as crystal originated particle (COP), it has been observed that the surface roughness is rapidly increased during the SC1 procedure. Furthermore, it has been also confirmed that a dielectric breakdown voltage is reduced in the gate insulation film, namely, oxide film after the SC1 procedure. Such a reduction of the dielectric breakdown voltage results from micro pits caused to occur on the surface due to the defects. Specifically, it is known in the art that the density of COP becomes high in a CZ wafer.

At any rate, an increase of the surface roughness should be suppressed during the SC1 procedure, as mentioned before. To this end, it is preferable to use a silicon substance that is subjected to hydrogen annealing, argon annealing, or the like and that reduces remnant oxygen to the extent of 5E 16/cm$^3$ or to use a silicon wafer on which a silicon film is deposited by epitaxial growth and which may be referred to as a silicon wafer with an epitaxial film. Specifically, the silicon wafer with the epitaxial film is used in the illustrated example.

As described before, it has been confirmed that the silicon surface processed by the SC1 procedure reduced in the OH concentration has the surface roughness Ra of 0.15 nm where Ra is representative of an arithmetical mean deviation of surface. As a result, it has been found out that the mobility of the n-type transistor can be improved in comparison with that of the conventional n-type transistor.

Practically, the silicon surface with the (110) crystal plane orientation has been subjected to the above-mentioned SC1 procedure and had the arithmetical mean deviation of surface Ra of 0.15 μm. Under the circumstances, the n-type transistor has been manufactured on the silicon surface of (110) in a manner similar to the silicon surface (100).

In this case, it has been found out that the mobility of the n-type transistor formed by the silicon surface with (110) is reduced as an increase of the arithmetical mean deviation of surface Ra and should be restricted to less than 0.15 nm, preferably 0.1 μm. Otherwise, it is difficult to obtain a preferable n-type transistor which is formed by the use of the (110) silicon and which has a mobility similar to that of the (100) silicon.

From this fact, it is readily understood that the (110) silicon surface should be flattened more and more so as to realize a similar property or mobility to the (100) silicon surface.

In FIG. 3 (c), a self-sacrifice film 303 is at first formed by oxidizing the surface of the device region within an atmosphere including oxygen radicals. When the self-sacrifice oxide film 303 is formed within the oxygen radical atmosphere, it has been confirmed that the self-sacrifice oxide film 303 has a surface flattened in comparison with a pre-surface prior to the formation of the self-sacrifice oxide film 303.

Figure 4:
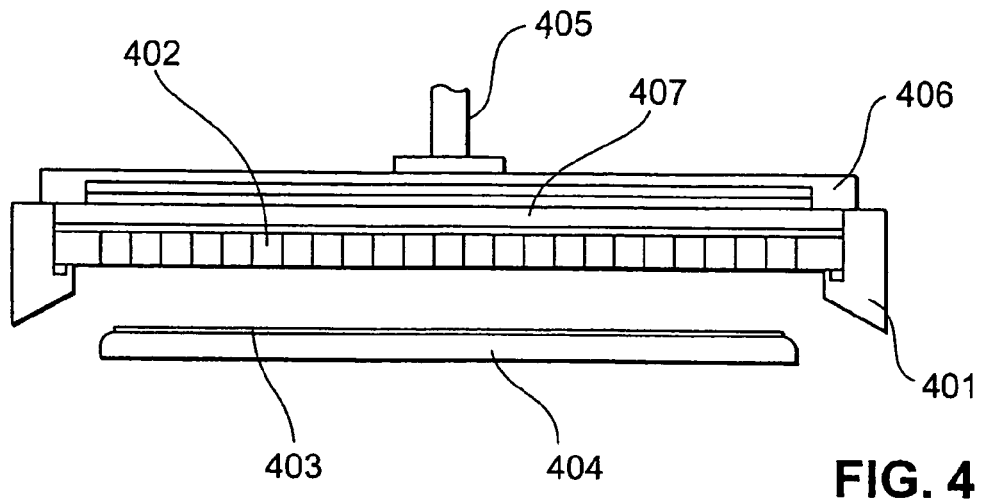
FIG. 4 shows a sectional view for describing an apparatus for use in the method illustrated in FIG. 3.

Herein, description will be directed to the radical oxidation used in FIG. 3 (c) with reference to FIG. 4.

In FIG. 4, an apparatus is exemplified which is used in a radical oxidation process according to this invention and which uses a radial line slot antenna. The illustrated apparatus is similar in structure to a plasma apparatus mentioned in Japanese Patent Publication No. Hei 10-33362 (namely, 33362/1998). In this invention, the illustrated apparatus is used for forming the silicon oxide film.

Specifically, the apparatus illustrated in FIG. 4 has a vacuum chamber 401 surrounding a hollow space therein, a shower plate 402 placed on the vacuum chamber 401 and faced to the hollow space, and a support or pedestal member 404. On the shower plate 402, are arranged a coaxial wave guide 405, a radial line slot antenna 406, and a dielectric plate 407. With this structure, a silicon substance 403 is placed on the support member 404 and faced towards the shower plate 402.

It is assumed that the illustrated support member 404 has a heater mechanism (not shown) and the silicon substance 403 has a (110) surface of the (110) crystal plane orientation and placed as a specimen on the support member 404.

Under the circumstances, the silicon substance 403 is heated to about 400° C. by the heater mechanism while the vacuum chamber 401 is evacuated into a vacuum state.

According to the experiments, when the silicon substance 403 is kept at a temperature between 200 and 550° C., similar results have been obtained.

Subsequently, Kr gas and $O_2$ gas are introduced into the hollow space through the shower plate 402 to a pressure of about 1 Torr. A microwave of 2.45 GHz is supplied to the vacuum chamber 401 through the coaxial wave guide 405, the radial line slot antenna 406, and the dielectric plate 407 to generate high density plasma within the vacuum chamber 401. Although the microwave with the frequency of 2.45 GHz is used in the illustrated example, similar results can be achieved when the frequency of the microwave may fall within a range between 900 MHz and 10 GHz.

A gap between the shower plate 402 and the silicon substance 403 is equal to 6 cm in the illustrated example. A high speed oxidation can be accomplished as the gap between the shower plate 402 and the silicon substance 403 becomes narrow. Instead of the radial line slot antenna, any other methods may be used to introduce a microwave into the vacuum chamber 401.

In the case of oxidizing the silicon surface within an atmosphere including the oxygen radicals, seeds or species for oxidation is liable to be adhered to projections caused to occur due to roughness on the silicon surface. Furthermore, when the radicals impinge onto the projections, the projections are charged with negative electricity and are susceptible to attract oxygen ions, such as O+ and $O_2$+. This results in preferential oxidation of the projections. In consequence, a flattened silicon oxide film is assumed to be formed on the silicon surface.

Figure 5:
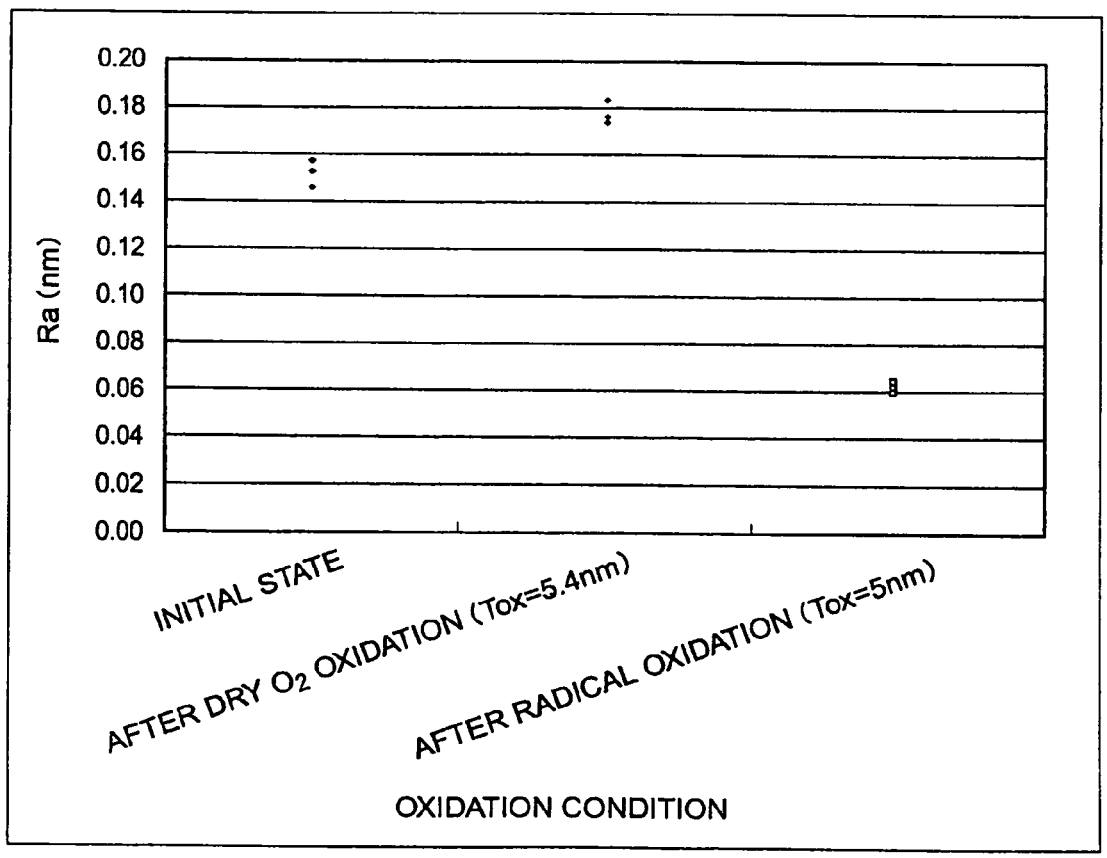
FIG. 5 shows a graphical representation for describing an effect of the method illustrated in FIG. 3.

Referring to FIG. 5, flatness states are illustrated by comparing a surface roughness (Ra) before and after oxidation. The surface roughness (Ra) before oxidation is shown in FIG. 5 as dots of an initial state while the surface roughness (Ra) after oxidation is measured both after dry $O_2$ oxidation and after radical oxidation and is shown by two sets of three dots in FIG. 5. Herein, it is to be noted that the initial state is a state after the SC1 procedure of the low OH concentration, as mentioned before, and the surface roughness is represented by the arithmetical mean deviation of surface (Ra) in FIG. 5.

As readily understood from FIG. 5, the surface roughness (Ra) before oxidation (namely, the initial state) falls between 0.14 nm and 0.16 nm while the surface roughness (Ra) after $O_2$ dry oxidation exceeds 0.16 nm and falls between 0.17 nm and 0.19 nm. On the other hand, the surface roughness (Ra) after the radical oxidation is extremely reduced to less than 0.08 nm and falls between 0.06 nm and 0.07 nm. This shows that the radical oxidation is helpful to improve flatness of the silicon surface of the plane orientation (110), contrary to the fact that the surface roughness (Ra) is roughened after the dry oxidation.

Thus, an oxide film is formed by the radical oxidation on the silicon surface cleaned by the RCA SC-1 cleaning liquid with a reduced OH concentration and as a result of the formation of this oxide film, the silicon surface is flattened to the surface roughness (Ra) of 0.06 nm or so. Therefore, this oxide film may not be removed and can be used as an insulation film covering the flattened silicon surface, such as a gate insulation film in case of an MOS transistor. The oxide film may be used as such insulation film by itself or combined with an additional insulating film.

The surface roughness (Ra) after oxidation is measured after the silicon oxide film is removed by dipping the silicon oxide film for one minute within a mixed solution of HF and HCl (volume ratio of HF:HCl=1:19). Using such a mixed solution of HF and HCl is for reducing OH ions as low as possible to prevent the silicon surface from being etched on removing the silicon oxide film. This makes it possible to precisely investigate an interface or a boundary between the silicon and the gate insulation film.

In order to observe an influence of the mixed solution of HF and HCl, the surface roughness (Ra) of the surface of the (110) silicon substance is measured before the (110) silicon substance is immersed or dipped into the mixed solution of HF and HCl and is also measured after it is dipped into the mixed solution for ten minutes. In consequence, it has been found out that no variation of the surface roughness (Ra) has been observed on the (110) silicon substance before and after dipping. This shows that no etching is caused to occur on the (110) silicon due to the mixed solution of HF and HCl. Thus, the above-mentioned method is reasonable for evaluating the silicon surface.

At any rate, the surface roughness (Ra) of the silicon surface laid under the insulation film is defined by a value measured after the insulation film is removed by dipping the mixed solution of HF and HCl for one minute, as mentioned before.

Thus, the surface flatness can be improved by radical oxidation procedure. This flattening technique of using the radical oxidation procedure is not restricted to the (110) crystal plane orientation and a semiconductor device using the (110) silicon substance but can be applied to any other semiconductor elements.

Now, referring back to FIG. 3 (d), the self-sacrifice oxide film 303 formed in FIG. 3 (c) is removed from the silicon substance 301. In the illustrated example, the self-sacrifice oxide film 303 is removed by the use of the mixed solution of HF and HCl mixed at the volume ratio of 1:19. The mixed solution is not greater than 1 in pH.

As shown in FIG. 3 (e), the silicon surface of the device region is oxidized within an oxygen radical atmosphere to form a gate insulation film ($SiO_2$) 304 which has a thickness of 5 nm.

In this situation, the silicon substance 301 with the gate insulation film 304 is removed to evaluate an interface or a boundary roughness between the silicon surface and the gate insulation film. To this end, a mixed solution is used which mixes HF and HCl at a volume ratio of 1:19 and which has the pH not greater than 1. The gate insulation film 304 is dipped within the mixed solution for one minute to remove the gate insulation film 304. As a result, it has been confirmed that the silicon surface has the arithmetical mean deviation of surface (Ra) of 0.06 nm.

Herein, it is noted that the silicon oxide film ($SiO_2$) may be formed at least at a portion contacted with the silicon surface and an additional insulation film may be deposited on the silicon oxide film. Such an additional insulation film may be formed by materials different from silicon oxide and may be, for example, an oxide film, a nitride film, an oxynitride film, or a silicate film of alkaline earth metals, rare earth metals, and transition metals. The additional insulation film may be structured by a single film or a plurality of films. Alternatively, the additional insulation film may include at least one of silicon oxide film or films, silicon nitride film or films, and silicon oxynitride film or films.

Preferably, the gate insulation film may be formed by a high dielectric constant film. Materials used as the high dielectric constant film are exemplified and may be, for example, metal silicate formed by one or more elements selected from Hf, Zr, Ta, Ti, La, Co, Y, and Al; metal oxide formed by one or more elements selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba; metal nitride formed by one or more elements selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba; or metal oxynitride formed by one or more elements selected from Si, Hf, Zr, Ta, Ti, Y, Nb, Na, Co, Al, Zn, Pb, Mg, Bi, La, Ce, Pr, Sm, Eu, Gd, Dy, Er, Sr, and Ba.

Turning back to FIG. 3 (*f*), boron (B) is ion-implanted on the whole of the silicon substance 301 so as to control a threshold voltage. After ion implantation of boron, a poly-silicon film is deposited on the whole of the silicon substance 301 and is thereafter patterned to leave a poly-silicon electrode (namely, a gate electrode) 305 on the gate insulation film 304 located on the device or element regions 302.

Next, phosphorus of a low density is ion-implanted to form an n− source region and an n− drain region (collectively designated by 306 in FIG. 3 (*h*)). Such n-source and n− drain regions 306 serve to mitigate a high electric field.

The process shown in FIG. 3 (*h*) is followed by a process shown in FIG. 3 (*i*). In this process, a silicon oxide ($SiO_2$) film is deposited by a CVD method or the like so that the gate electrode 305 is covered with the silicon oxide film. Thereafter, the silicon oxide film is subjected to anisotropic etching to leave a side wall insulation film 307 on a side wall of the gate electrode 305.

Subsequently, an n-type impurity, such as arsenic, is ion-implanted with a high density to form an n+ source region and an n+ drain regions (308), as shown in FIG. 3 (*j*). Thus, an n-type transistor can be manufactured through the above-mentioned processes.

Now, an investigation has been made about a relationship between the surface roughness (Ra) after the RCA cleaning (shown in FIG. 3 (*b*)) and the mobility. Specifically, the arithmetical mean deviation of surface Ra has been changed between 0.05 nm and 0.18 nm by varying a concentration of aqueous ammonia ($NH_4OH$) and the mobility has been measured to investigate a relationship between the mobility and the surface roughness Ra. This investigation serves to know a scattered component of a carrier which occurs by the surface roughness and which influences the mobility.

Figure 6:
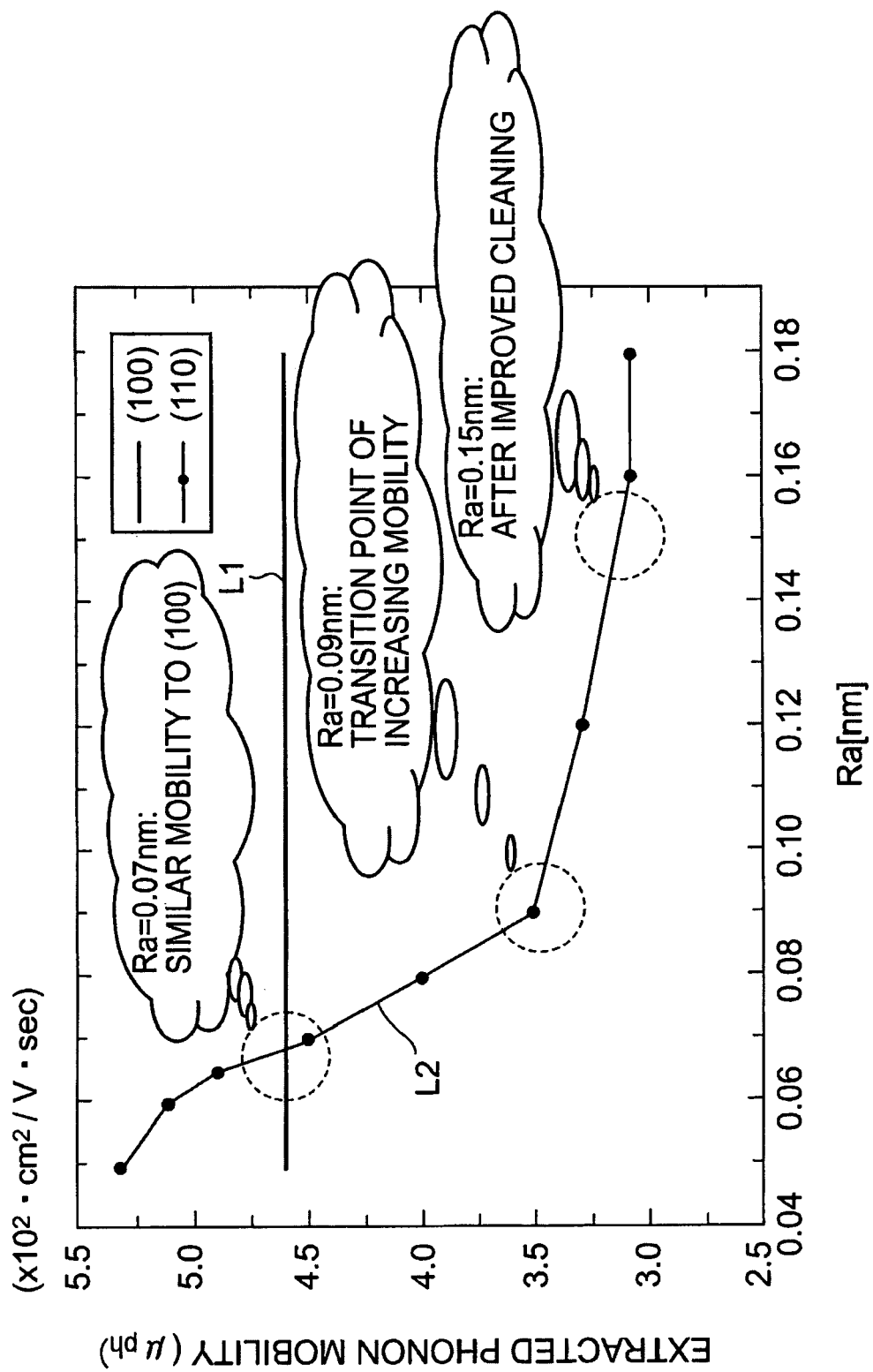
FIG. 6 shows a graphical representation for use in describing a relationship between roughness and mobility.

Referring to FIG. 6, the relationship between the mobility and the surface roughness (Ra) is illustrated which represents an outcome of the above-mentioned investigation. In FIG. 6, the surface roughness (Ra) and the mobility are taken along the abscissa and the ordinate, respectively, and lines L1 and L2 show the above-mentioned relationships in connection with the (100) and the (110) silicon substances, respectively. As readily understood from the line L1, the mobility is substantially kept unchanged even when the surface roughness becomes large.

On the other hand, the mobility becomes large when the surface roughness Ra becomes small, as shown by the line L2. More specifically, the (110) silicon substance shows a mobility of $3.0 \times 10^2$ ($cm^2$ Vsec) when the surface roughness Ra is as large as 0.16 nm that is obtained by the above-mentioned RCA cleaning procedure. The mobility of the (110) silicon substance is rapidly increased when the surface roughness Ra is smaller than 0.09 nm, as shown by the line L2. Moreover, when the surface roughness Ra is equal to 0.07 nm, the mobility of the (110) silicon substance is substantially equivalent with that of the (100) silicon substance.

From this fact, it is readily understood that the mobility of the (110) silicon-substance is greatly improved when the arithmetical mean deviation of surface Ra is reduced to 0.05 nm. Such a surface roughness Ra can be accomplished by forming the self-sacrifice oxide film by the radical oxidation and by removing the self-sacrifice oxide film. In this event, the self-sacrifice oxide film may not always be removed but can be used as the gate insulation film or a part of the gate insulation film.

As mentioned before, the surface roughness Ra of 0.05 nm has been achieved in the first embodiment. This shows that the mobility of the n-type transistor can be improved by 1.6 times in comparison with the conventional method. In addition, it is also possible to improve reliability of the gate insulation film when the interface between the silicon surface and the gate insulation film is flat. The improvement of the carrier mobility on the (100) silicon substance can be utilized not only in the field effect transistor but also is available to any other semiconductor devices, such as TFT (Thin Film Transistor), CCD (Charged Coupled Device), IGBT (Insulated Gate Bipolar Transistor), and so on.

Second Embodiment

Figure 7:
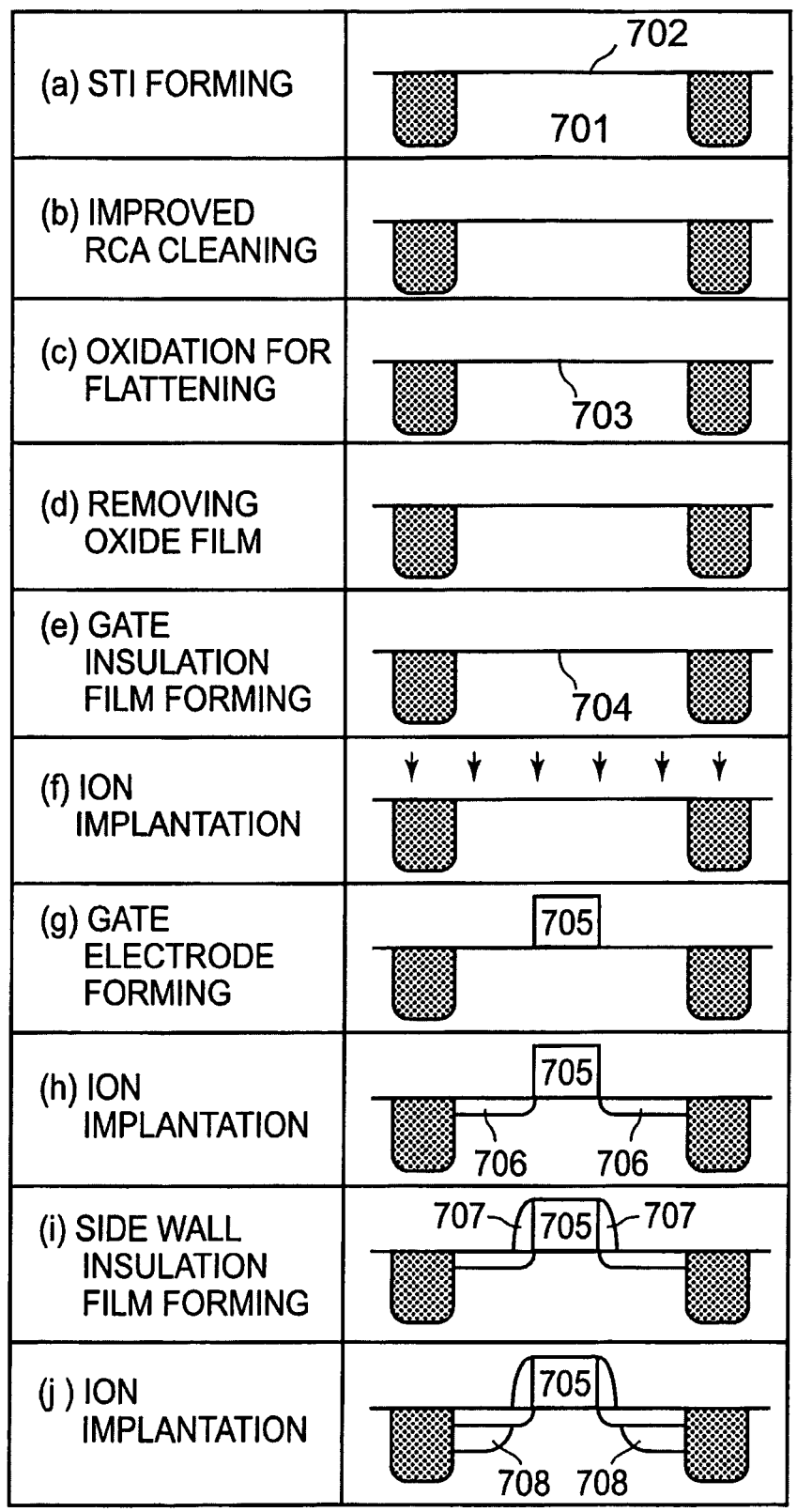
FIG. 7 shows a method of manufacturing a semiconductor device according to a second embodiment of this invention.

Referring to FIG. 7, description will be made about a method of manufacturing a semiconductor device, according to a second embodiment of this invention. Instead of the (110) silicon surface which is used in the first embodiment and which is formed by the epitaxial growth, a silicon surface obtained by inclining the (110) silicon surface by 8° in a direction of <100> is used in the second embodiment and may be said as (551) silicon surface. In addition, it is to be noted that a silicon oxynitride film is used as the gate insulation film in the second embodiment.

As shown in FIG. 7 (*a*), the silicon substance 701 of the p-type is prepared which has a surface (551) with a (551) crystal plane orientation and which is simply called a (551) silicon substance. In this connection, the surface of the plane orientation (551) may be referred to as (551) silicon surface. On the (551) silicon surface, a trench isolation region is formed, for example, by a shallow trench isolation (STI) technique and, as a result, a device region 702 isolated by the trench isolation region is left on the (551) silicon surface and serves to form source and drain regions together with a channel region of a field effect transistor.

Next, the device region 702 is subjected to the RCA cleaning in a manner mentioned in conjunction with the first embodiment (as shown in FIG. 7 (*b*)), so as to remove contamination due to organic matters, particles, and metals. Like in the first embodiment, the mixed solution has a reduced concentration of OH and the ratio of $NH_4OH:H_2O_2:H_2O$ is 0.05:1:5. Thus, such a mixed solution is effective to suppress an increase of the surface roughness during the SC1 procedure.

Subsequently, a self-sacrifice oxide film 703 is formed on the device region 702 of the (551) silicon surface at a temperature between 300° C. and 500° C. in an oxygen radical atmosphere, as shown in FIG. 7 (*c*). The self-sacrifice oxide film 703 is removed in a process shown by FIG. 7 (*d*). Both the processes illustrated in FIGS. 7 (*c*) and (*d*) may be collectively called a flattening process of flattening the silicon surface of the device region.

Removing the self-sacrifice oxide film 703 is done by the use of a mixed solution in which HF and HCl are mixed at the volume ratio of 1:19 and which is not higher than 1 in pH.

Figure 8:
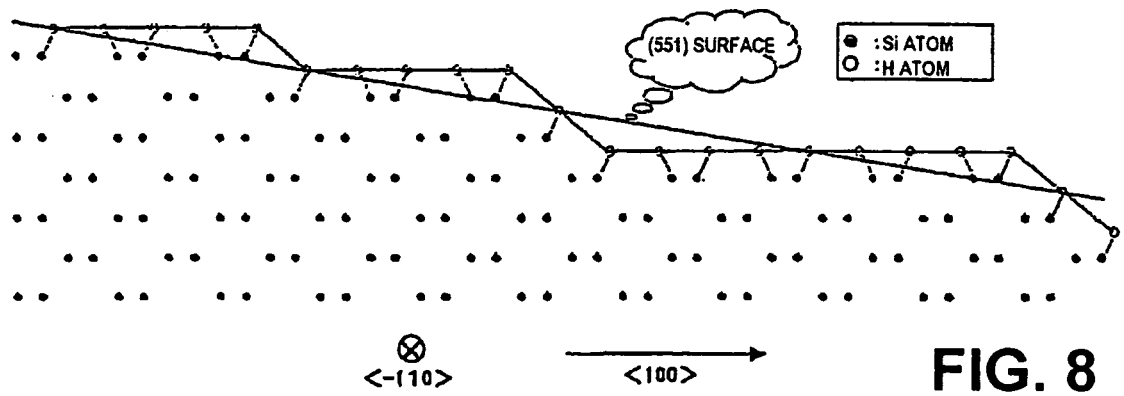
FIG. 8 shows a state of a (551) surface when the surface is used in the method illustrated in FIG. 7.

Temporarily referring to FIG. 8, a surface state of the silicon surface has been observed after the self-sacrifice oxide film 703 is removed. As shown in FIG. 8, (110) planes appear in the form of terraces and a stepwise configuration appears along <−110> direction in a self-aligned manner. Preferably, the height of each step falls within a range between 0.17 and 0.35 nm and the surface roughness is about 0.04 nm when the surface roughness is represented by the arithmetical mean deviation of surface Ra.

Referring back to FIG. 7 (*e*), the (551) silicon surface on the device region is oxidized within an oxygen radical atmosphere to form a gate insulation film 704 which is composed of oxynitride in this example, as mentioned before.

In this situation, an interface roughness between the (551) silicon surface and the gate insulation film has been evaluated, like in the first embodiment. To this end, the gate insulation film 704 has been removed by dipping within a mixed solution which mixed HF with HCl at a volume ratio of 1:19 and which was not higher than 1 in pH. As a result, it has been confirmed that the interface roughness is as low as 0.05 nm in the arithmetical mean deviation of surface (Ra). For comparison, the (551) silicon surface subjected to no formation of any self-sacrifice oxide film has been investigated and had the arithmetical mean deviation of surface Ra of 0.15 nm.

The gate insulation film of silicon oxynitride can be formed by the use of the microwave excitation plasma apparatus illustrated in FIG. 4. Specifically, such a silicon oxynitride film can be formed in a manner to be mentioned below. At first, the vacuum chamber 401 illustrated in FIG. 4 is evacuated and Kr gas, $O_2$ gas, and $NH_3$ gas are filled through the shower plate 402 into the vacuum chamber 401 to a pressure of 1 Torr. On the support member 404 with the heater member, the (551) silicon substance is located and is heated to a temperature of 400° C. The temperature may fall within a range between 200° C. and 550° C.

Under the circumstances, a microwave of 2.45 GHz is supplied from the coaxial wave guide 405 through the radial line slot antenna 406 and the dielectric plate 407 to the vacuum chamber 401. In consequence, high density plasma is generated within the vacuum chamber 401. In the illustrated example, a gap between the shower plate 402 and the silicon substance 403 is set to 6 cm. Such a microwave can be introduced into the vacuum chamber 401 in any other methods different from the illustrated method.

Herein, it is to be noted that existence of hydrogen is a very important factor on forming the silicon oxynitride according to this invention. More specifically, when hydrogen is present in the plasma, dangling bonds in the silicon oxynitride film and in the interface are terminated by forming Si—H bonds and N—H bonds and bring about extinction of electron traps in the silicon oxynitride film and the interface. Such existence or presence of the Si—H bonds and N—H bonds has been confirmed by measuring F11R and XPS. In addition, existence of hydrogen serves to extinguish a hysteresis of a CV characteristic and to reduce an interface density between the silicon substance and the silicon oxynitride film to $3 \times 10^{10}$ com$^{-2}$.

In addition, it has been found out that, when the silicon oxynitride film is formed by the use of a mixed gas of a rare gas (Ar or Kr), $O_2$, $N_2$, and $H_2$, traps of electrons and holes in the films can be drastically decreased by setting a partial pressure of hydrogen to 0.5% or more.

With the apparatus illustrated in FIG. 4, it is possible to form a silicon nitride film also by changing the gas introduced into the vacuum chamber, for example, to Kr gas and $NH_3$ gas.

The silicon oxynitride film or the silicon nitride film may be formed only on a portion contacted with the silicon surface. As mentioned in conjunction with the first embodiment, an upper film on the silicon oxynitride film or the silicon nitride film may be single or a plurality of insulation films formed by oxide, nitride, oxynitride, silicate composed of alkaline earth metals, rare earth metals, and transition metals.

Turning back to FIG. 7, boron (B) is ion-implanted on the whole of the (551) silicon surface 701 after the gate insulation film 704 is formed, as shown in FIG. 7 (f), like in the first embodiment.

Subsequently, a poly-silicon film is deposited on the whole of the (551) silicon surface 701 to be patterned into a poly-silicon electrode 705 which is left on the gate insulation film of the device region 702 and which is operable as the gate electrode, as shown in FIG. 7 (g).

As illustrated in FIG. 7 (h), phosphorus of a low density is ion-implanted to form a n− source region and a n− drain region 706 to mitigate a high electric field.

A silicon oxide ($SiO_2$) film is deposited on the whole of the (551) silicon surface 701 and is anisotropically etched to leave a side wall insulation film 707 left on the side wall of the gate electrode 705, as shown in FIG. 7 (i). Thereafter, the n-type impurity, such as arsenic, of a high density is ion-implanted to form n+ source region and n+ drain region. Thus, the n-type transistor is attained (FIG. 7 (j)).

When the carrier mobility has been evaluated, it has been confirmed that the field effect transistor has a mobility of 1.6 times, as compared with the conventional transistor and that the second embodiment has advantages similar to those in the first embodiment.

Third Embodiment

A method of improving flatness will be described as a third embodiment and is specified by the use of wet oxidation. At first, a (110) silicon substance is prepared which has a silicon surface of a comparatively large roughness. The silicon substance is subjected at a first step to wet oxidation under the conditions of a temperature of 1000° C. and flow rates of $H_2=1$ slm and $O_2=1$ slm and, as a result, a silicon oxide film is deposited to a thickness of 3000 angstroms on the silicon surface. The silicon oxide film is etched back to a thickness of 0 to 2500 angstroms by the use of $H_2O$ solution including HF at a second step. Thereafter, the first and the second steps are repeated twice and finally the silicon oxide film is completely removed by a mixed solution of HF and HCl which is mixed with a mixed rate of 1:19 and which is not higher than 1 in pH.

Figure 9:
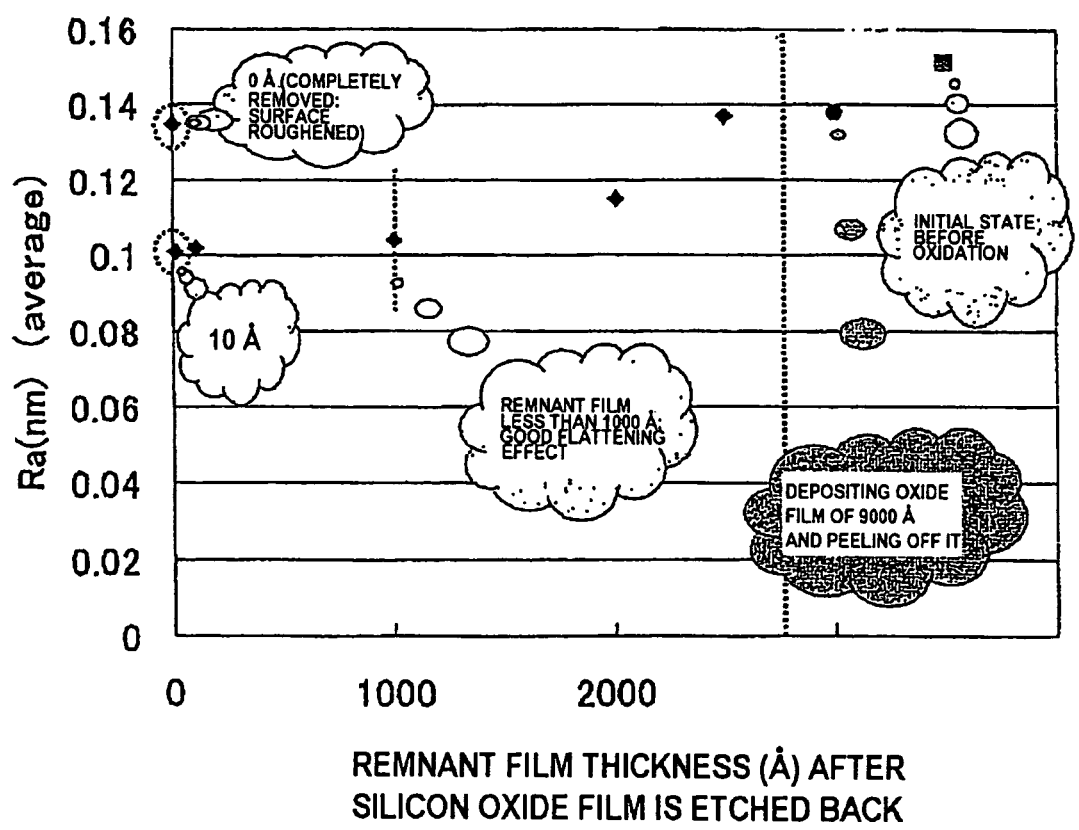
FIG. 9 shows a graphical representation for use in describing a relationship between a roughness and a remaining film left by an etched back process.

Referring to FIG. 9, the results of the above-mentioned method has been shown wherein an abscissa represents a remaining thickness (angstroms) of the silicon oxide film after the second step and an ordinate represents an arithmetical mean deviation of surface (Ra). For reference, an example is also illustrated wherein a silicon oxide film is deposited to a thickness of 9000 angstroms at one time and is removed by a mixed solution of HF and HCl which is mixed with a ratio of 1:19 and which is not higher than 1 in pH.

In consequence, the arithmetical mean deviation of surface (Ra) is decreased as the remaining thickness etched back at the second step becomes thin and when the remaining thickness reaches 1000 angstroms, the arithmetical mean deviation of surface (Ra) is substantially saturated. However, the silicon oxide film is completely removed and the remaining film is rendered into 0, the flatness becomes bad.

This might be anticipated due to the fact that, when the silicon surface is exposed by the solution process, the silicon surface is roughened by the solution itself because the solution attacks the silicon surface and brings about adherence of metals or contamination and the like. In addition, a flatness effect is improved by repeating the first and the second steps when the remaining thickness in the second step is adapted to a thickness of, for example, 100 angstroms, in comparison with the case where the silicon oxide film is deposited to 9000 angstroms at one time and is removed.

No proof has been made about a mechanism of improvement of a flatness effect due to the oxidation and the etch back process at the present. It has been anticipated that, as the remaining film becomes thin due to the etch back process, species or seeds for oxidation would be liable to be uniformly reached to adjacent regions to the interface between the silicon substance and the silicon oxide film.

Figure 10:
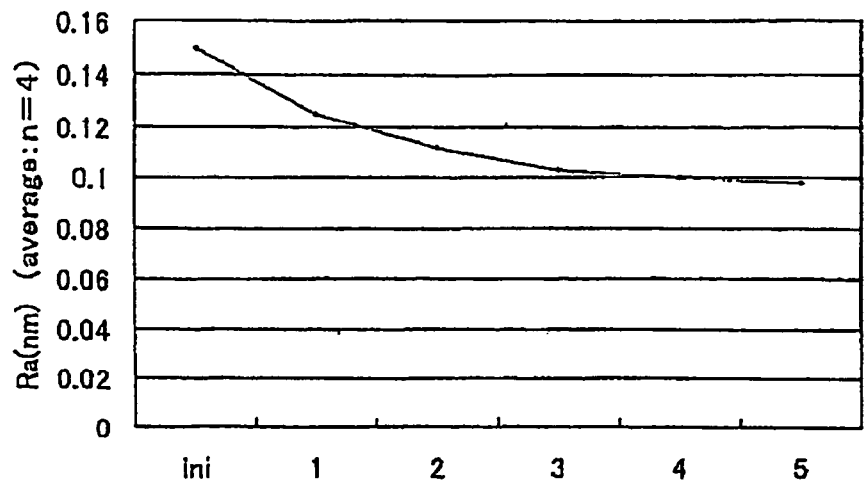
FIG. 10 shows a graphical representation for use in describing a relationship between repeat times of first and second steps and the roughness.

Referring to FIG. 10, a relationship between repeat times of the first and the second steps and flatness is investigated and illustrated. In FIG. 10, the abscissa and the ordinate are representative of the repeat times and the arithmetical mean deviation of surface (Ra), respectively. As shown in FIG. 10, when the repeat times exceed three times, the arithmetical mean deviation of surface Ra tends to be saturated. From this fact, it has been confirmed that the repeat times should be optimized.

Thus, the silicon surface can be flattened as compared with an initial silicon surface by carrying out oxidation by the wet gas (the first step), by etching back an oxide film at the second step to a thickness between 10 angstroms to 1000 angstroms without removing the oxide film, by repeating the first and the second steps desired times, and by finally partially or completely removing the oxide film by the use of an aqueous solution including HF.

Fourth Embodiment

Next, a method of maintaining and improving flatness by the use of a medical solution or fluid will be described as a fourth embodiment of this invention. As mentioned before, the RCA cleaning has been very often used to clean the silicon surface. In addition, it has been also found out that a silicon surface is roughened during the SC1 procedure of the RCA cleaning. This is because the SC1 procedure is carried out by the mixture of hydrogen peroxide, ammonium hydroxide, and water heated to a temperature of about 80° C. and, as a result, Si—Si bonds are attacked by OH ions during the SC1 procedure and torn at weak portions. Specifically, in the SC1 procedure, oxidation of the silicon surface due to the hydrogen peroxide proceeds simultaneously with Si—O etching due to OH ions and etch back due to Si—Si etching. This implies that the SC1 procedure is effective to remove the particles and organic contamination but roughens the silicon surface as a side effect. In order to decrease roughness of the silicon surface due to the SC1 procedure, it is preferable to dispense with alkaline cleaning.

Taking the above into consideration, a cleaning method is disclosed in Japanese Unexamined Patent Publication No. Hei 11-057636 (namely, 057636/1999) and includes no alkaline cleaning. It is to be noted that the disclosed cleaning method has five stages and is not less than the RCA cleaning in an ability of removing particles, organic contamination, and metal contamination.

Specifically, the cleaning method disclosed in the above-mentioned publication has a first step of doing cleaning by the use of pure water including ozone, a second step of doing cleaning by a cleaning solution including HF, $H_2O$, and a surface-active agent, providing a vibration of a frequency of 500 kHz or more, a third step of doing cleaning pure water including ozone, a fourth step of doing cleaning by a cleaning solution including HF and $H_2O$ effective for removing a silicon oxide film, and a fifth step of doing cleaning by pure water.

As mentioned above, the cleaning method described in the Japanese Unexamined Patent Publication No. 057636/1999 includes no alkaline process. However, the above-mentioned publication never teaches the silicon surface is roughened due to the cleaning. In fact, an example is shown wherein an arithmetical mean deviation of surface Ra is kept unchanged before and after the cleaning method. This means that no consideration is made at all in the above-referenced publication about the fact that the silicon surface is changed before and after the cleaning. In addition, the experiments mentioned in the publication have been made by the instant inventors and have been restricted to the (100) silicon substance which is 0.11 nm in the arithmetical mean deviation of surface. In other words, no experiments have been done in connection with the (110) silicon substance at all. Therefore, no disclosure has been made about the (110) silicon substance that has the arithmetical mean deviation of surface (Ra) not greater than 0.15 nm.

It has been found out that the above-mentioned method can not obtain the (110) silicon substance that is not greater than 0.15 nm in arithmetical mean deviation of surface.

Under the circumstances, the inventors have found out that the silicon surface of the (110) silicon substance is kept flat by reducing an amount of dissolved oxygen in the second and the fourth steps by carrying out deaeration from $H_2O$.

In the method according to the fourth embodiment of this invention, the second step is carried out to remove the silicon oxide film formed at the first step to eliminate particles while the fourth step is done to remove the silicon oxide film formed at the third step and to eliminate the metal contamination. More specifically, when the dissolved oxygen is present in the medical solution used in the second and the fourth steps, the silicon surface removed by HF is selectively re-oxidized at weak portions of Si—Si bonds. In this situation, when removing the silicon due to HF simultaneously proceeds, the surface roughness becomes large. Taking this into account, the dissolved oxygen in the second and the fourth steps is reduced from ppm order to less than 100 ppb (preferably, less than 10 ppb). The (110) silicon substance has been processed by the use of the deaerated medical solution and, as a result, it has been found out that the surface roughness could be maintained.

More specifically, the method according to the fourth embodiment of this invention has a first step of cleaning the (110) silicon substance for five (5) minutes in pure water including 5 ppm of ozone and a second step of doing cleaning for five minutes by the use of a cleaning solution including deaerated 0.5% HF solution, deaerated $H_2O$, and 50 ppm of surface-active agent. In the second step, the cleaning is done, providing a vibration of a frequency of 950 kHz. After the second step, the cleaning is done at the third step for five minutes by the use of pure water including 5 ppm of the ozone. Thereafter, the cleaning of the fourth step is also carried out for one minute by a cleaning solution including 0.5% HF and deaerated $H_2O$ to remove the oxide film and the cleaning of the fifth step is carried out for 10 minutes in ultrapure water wherein 0.1 to 50 ppm of H is added to deaerated $H_2O$.

Figure 11:
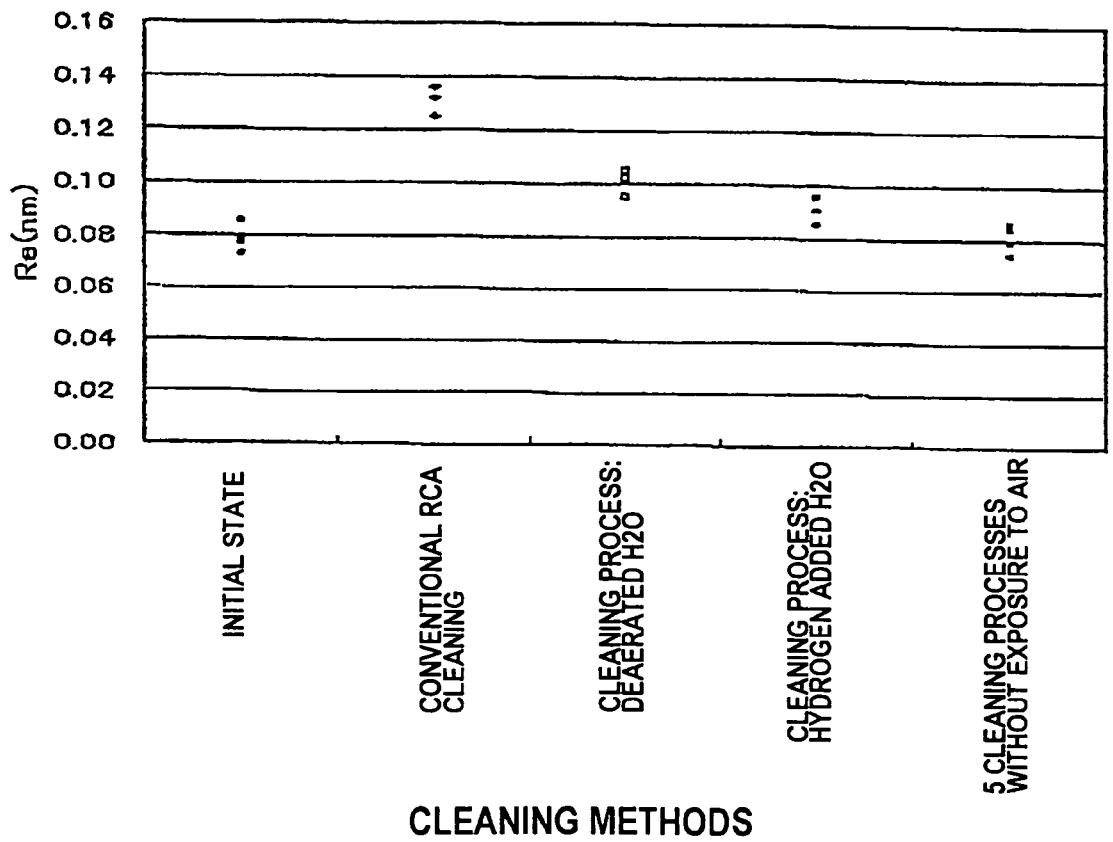
FIG. 11 shows a graphical representation for use in describing a relationship between various cleaning processes and the roughness.

In addition, the cleaning has been carried out by dipping or immersing the silicon substance in the cleaning solution. After the cleaning has been finished, the surface roughness of the (110) silicon surface has been measured. The results of the measurement is shown in FIG. 11 in comparison with the results of the conventional RCA cleaning. As shown in FIG. 11, when the silicon surface which has the arithmetical mean deviation of surface (Ra) of 0.08 nm prior to the cleaning is subjected to the conventional RCA cleaning, the arithmetical mean deviation of surface Ra is roughened to 0.13 nm. On the other hand, the silicon surface which is subjected to the above-mentioned cleaning can mitigate the roughness (Ra) to about 0.10 nm, as pointed out by dots.

The above-mentioned method or technique of mitigating the surface roughness of the (110) silicon surface by using the cleaning solution of HF and $H_2O$ deaerated to the dissolved oxygen less than 100 ppb is applicable not only to the (110) silicon substance but also to surfaces having various plane orientations. In addition, this invention can be used to remove either one of the silicon nitride film and/or the silicon oxynitride film.

The above-description has been made mainly about carrying out deaeration of $H_2O$ in the second and the fourth steps. Furthermore, attempts has been made about adding 0.5 to 50 ppm of hydrogen to decrease the dissolved oxygen and to lower density of OH ions.

In FIG. 11, the results of adding the hydrogen are also illustrated by dots in comparison with those of the RCA cleaning. Using such hydrogen-added $H_2O$ brings about somewhat roughening the initial surface of 0.08 nm by about 0.01 nm but is effective to mitigate the roughness in comparison with the RCA cleaning. Especially, when the vibration higher than 500 kHz is given in the second step, it has been observed that $H_2O$ is dissociated into H and OH and, as a result, the density of OH is increased. As mentioned before, the arithmetical mean deviation of surface (Ra) is substantially kept unchanged by cleaning by the use of a cleaning solution that includes HF, surface-active agent, and $H_2O$ to which hydrogen is added by 50 ppm after reducing the dissolved oxygen to less than 100 ppb. This shows that ultrasonic cleaning is carried out at the second step with occurrence of OH suppressed. In this event, the dissolved oxygen is preferably less than 10 ppb.

Alternatively, the first through the fifth steps have been made within an apparatus without exposing the silicon surface and the cleaning solution to an atmosphere. In this event, the medical solution which includes deaerated $H_2O$ together with 0.1 to 50 ppm of hydrogen added has been used in the second and the fourth steps. This method serves to prevent oxygen from being dissolved from the atmosphere. The results of the above-mentioned cleaning method are illustrated in FIG. 11 by rightmost dots. As shown in FIG. 11, the surface roughness (Ra=0.08 nm) of the initial surface is kept substantially unchanged after the above-mentioned cleaning.

The above-mentioned processing and cleaning of the semiconductor may be done by the use of only a non-alkaline solution that is less than 7 in pH. In this case, the ultrasonic cleaning may be carried out with occurrence of OH suppressed by adding $H_2$.

According to this invention, it is possible to reduce the arithmetical mean deviation of surface (Ra) of the silicon surface to less than 0.05 nm and, as a result, to accomplish 0.02 nm. Therefore, when the silicon substance with the (110) crystal plane orientation is used to manufacture a field effect transistor, the field effect transistor has the carrier mobility of 1.6 times that of the conventional transistor and is equivalent with the carrier mobility of the (100). In addition, it is possible to improve reliability of the gate insulation film because the interface between the silicon surface and the gate insulation film is atomically flat.

Figure 12:
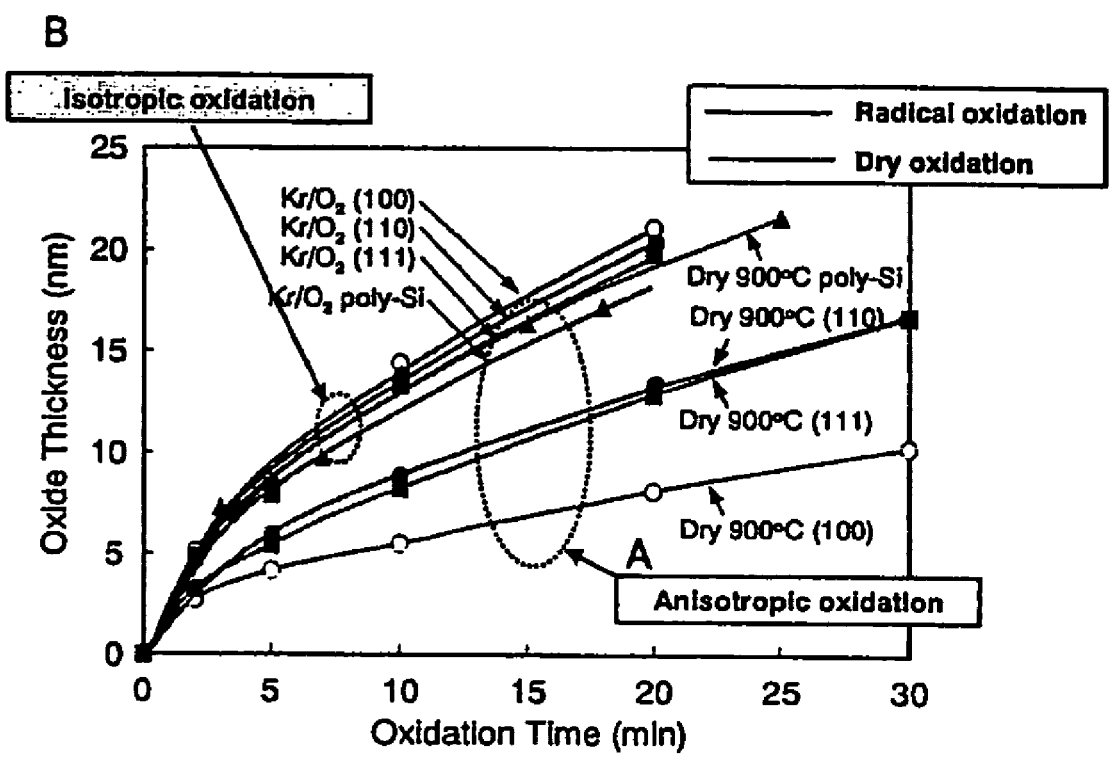
FIG. 12 shows a graphical representation for use in describing a variation of oxide film thickness and oxidation atmospheres.

In the above embodiments, it has been pointed out that the self-sacrifice oxide film is effective to flatten the silicon surface, such as (100), (110), (111), when the self-sacrifice oxide film is formed by radical oxidation. However, no improvement has been accomplished when the self-sacrifice oxide film is formed by dry oxidation. However, no reasons have been clarified in the above description. The inventors' studies have found out that the improvement of the flatness results from whether or not isotropic oxidation is carried out. To this end, description will be made with reference to FIG. 12. In FIG. 12, oxidation times and film thickness are shown along the abscissa and the ordinate, respectively, and dry oxidation is carried out in connection with (100), (110), and (111) silicon surfaces, as depicted by a group A of curves while radical oxidation is also carried out in connection with (100), (110), and (111) silicon surfaces, as shown by a group B of curves. The group A of the curves is greatly varied in dependency upon the plane orientations (110), (111), and (100) while the group B of the curves are kept substantially constant in an oxidation rate, regardless of the plane orientations (100), (110), and (111).

From this fact, it has been concluded that the radical oxidation is advanced in an isotropic manner and may be referred to as isotropic oxidation while the dry oxidation is progressive in an anisotropic manner and may be referred to as anisotropic oxidation.

Figure 13A:
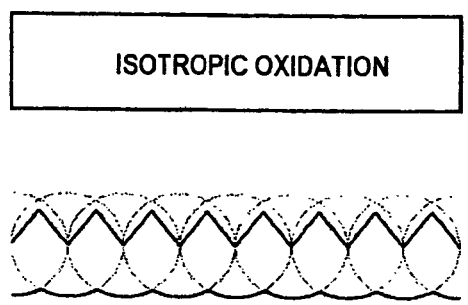
FIGS. 13A and 13B show schematic views for use in describing isotropic oxidation and anisotropic oxidation processes, respectively.
Figure 13B:
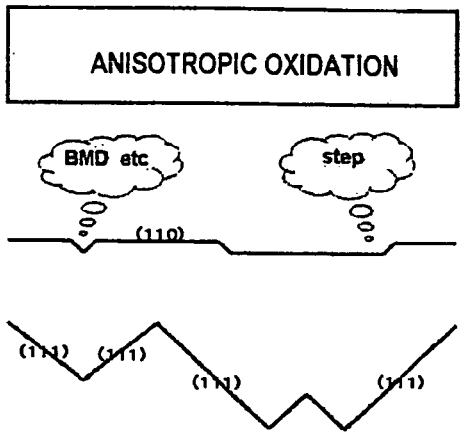

Referring to FIGS. 13A and 13B, relationships between the plane orientation and flatness are illustrated about the isotropic oxidation and the anisotropic oxidation, respectively. In FIG. 13A the isotropic oxidation is assumed to be carried out on a surface having irregularities depicted by real lines. In this case, the isotropic oxidation is isotropically advanced even in the presence of the irregularities and such fine irregularities are efficiently removed by a dotted line in FIG. 13A to be flattened. On the other hand, the anisotropic oxidation is carried out on a surface of the (110) plane orientation which has a bulk micro defect (BMD) and an atomic step. In this event, the anisotropic oxidation is selectively progressive only on a specific plane triggered by the BMD and the atomic step. As a result, the silicon surface is roughened as shown in a lower part of FIG. 13B.

From this fact, it is understood that the isotropic oxidation is very important so as to flatten a surface of a crystal, such as silicon, by oxidation, irrespective of the plane orientations.

According to the inventors' experimental studies, it has been found out that the isotropic oxidation can be realized by the use of ozone solution (ozone water) and hydrogen peroxide. In this event, a silicon surface is brought into contact with the ozone water by dipping the silicon surface into the ozone solution or by causing the ozone solution to flow or by being sprayed on the silicon surface.

Figure 14:
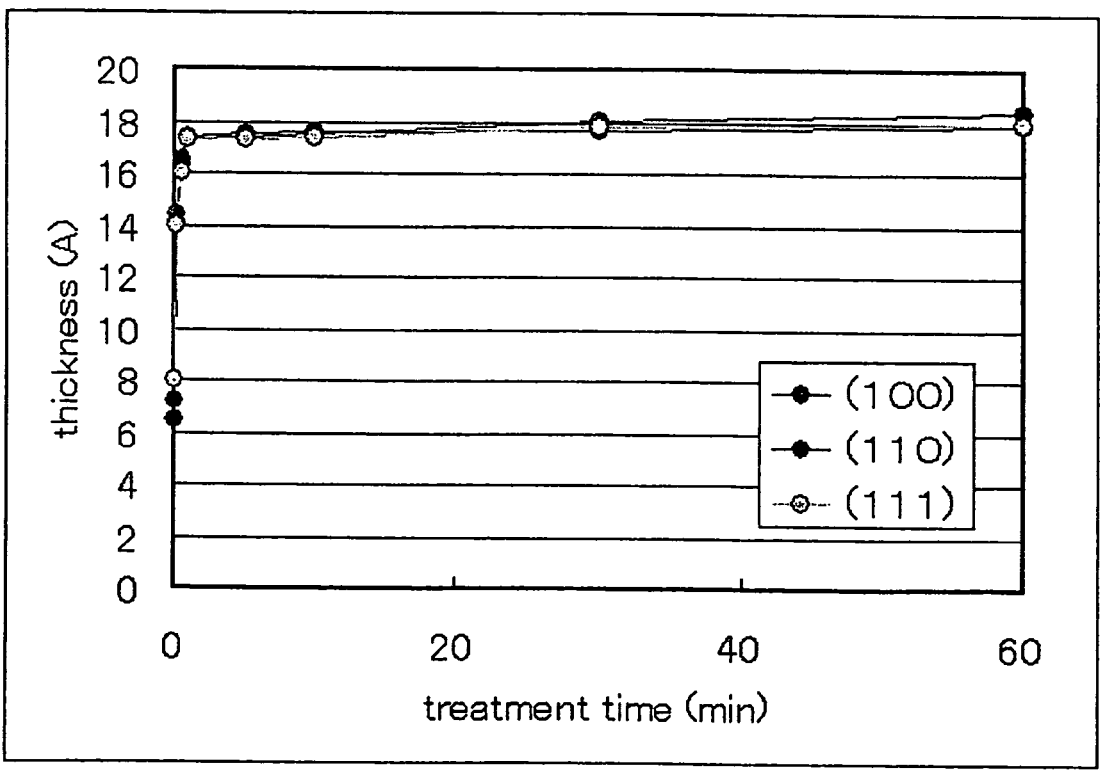
FIG. 14 shows a graphical representation for use in describing a relationship between a treatment time of the isotropic oxidation process and a thickness of an oxide film.

Referring to FIG. 14, treatment time (minute) and thickness (angstrom) of an oxide film are taken along the abscissa and the ordinate, respectively, so as to show a relationship between the treatment time and the thickness in the case where the silicon surface is contacted with the ozone solution.

In the experiment, ozone dissolved by 5 ppm in ultrapure water has been used as the ozone water and processing has been carried out in a room temperature (23° C.) in connection with the (100), (110), and (111) silicon substances, like in FIG. 12. The results of processing the (100), (110), and (111) silicon substances are depicted by gray dots, black dots, and white dots, respectively. As are apparent from FIG. 14, oxidation has proceed, without depending on the plane orientations (100), (110), and (111), which shows that isotropic oxidation has been done by using the above-mentioned ozone. In addition, it is readily understood from FIG. 14 that the thickness of each oxide film has been substantially saturated or reached to about 18 angstroms after the ozone processing has been carried out only for thirty seconds. Thereafter, the thickness of each oxide film is kept unchanged.

This implies that the treatment time of the self-sacrifice film may be as short as thirty seconds or so and the flattening processing can be finished within a very short time. Moreover, the above-mentioned method makes it possible to process each silicon substance one by one.

Similar processing is possible by the use of hydrogen peroxide solution, as will be described later in detail.

Herein, description will be made about the (110) silicon substance, as an example. At first, let the (110) silicon substance be subjected to anisotropic oxidation. In this event, it is known in the art that the (111) plane is preferentially oxidized and, as a result, grooves are liable to occur along a direction of <-110>.

On the other hand, such occurrence of the grooves can be avoided by the isotropic oxidation, as mentioned above. Specifically, a flattening method is carried out by forming a self-sacrifice oxide film by isotropic oxidation using radical oxidation, ozone water, hydrogen peroxide solution and by removing the self-sacrifice oxide film. The flattening method is very effective to flatten the silicon surface having the plane orientation of (110). Such a substantial plane orientation of (110) may include planes that are crystallographically directed to equivalent orientations with the plane orientation (110) and that may include the crystal plane orientations of (551), (311), (221), (553), (335), (112), (113), (115), (117), and the like.

Figure 1:
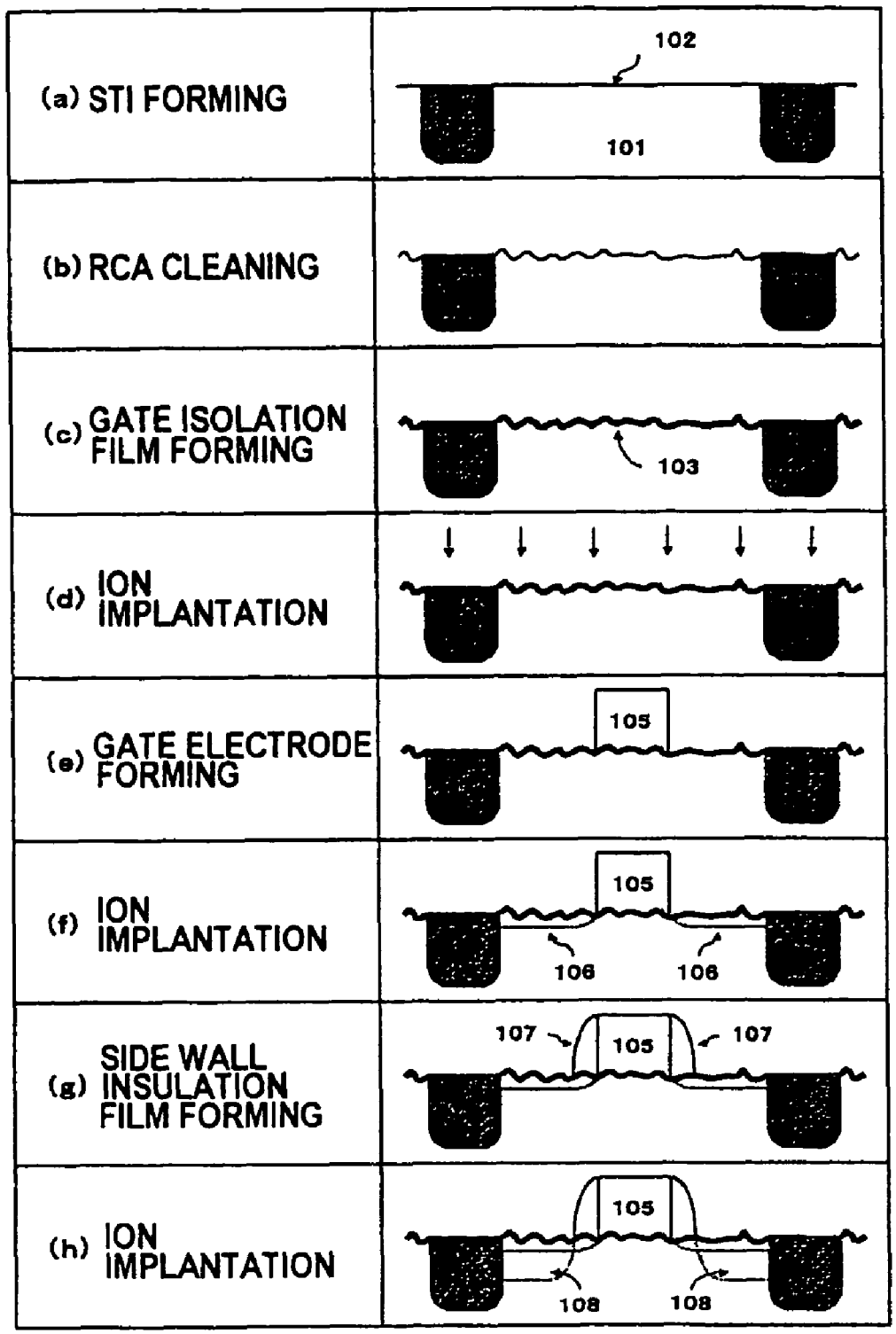
FIG. 1 shows a conventional method of manufacturing a semiconductor device in the process order.
Figure 2:
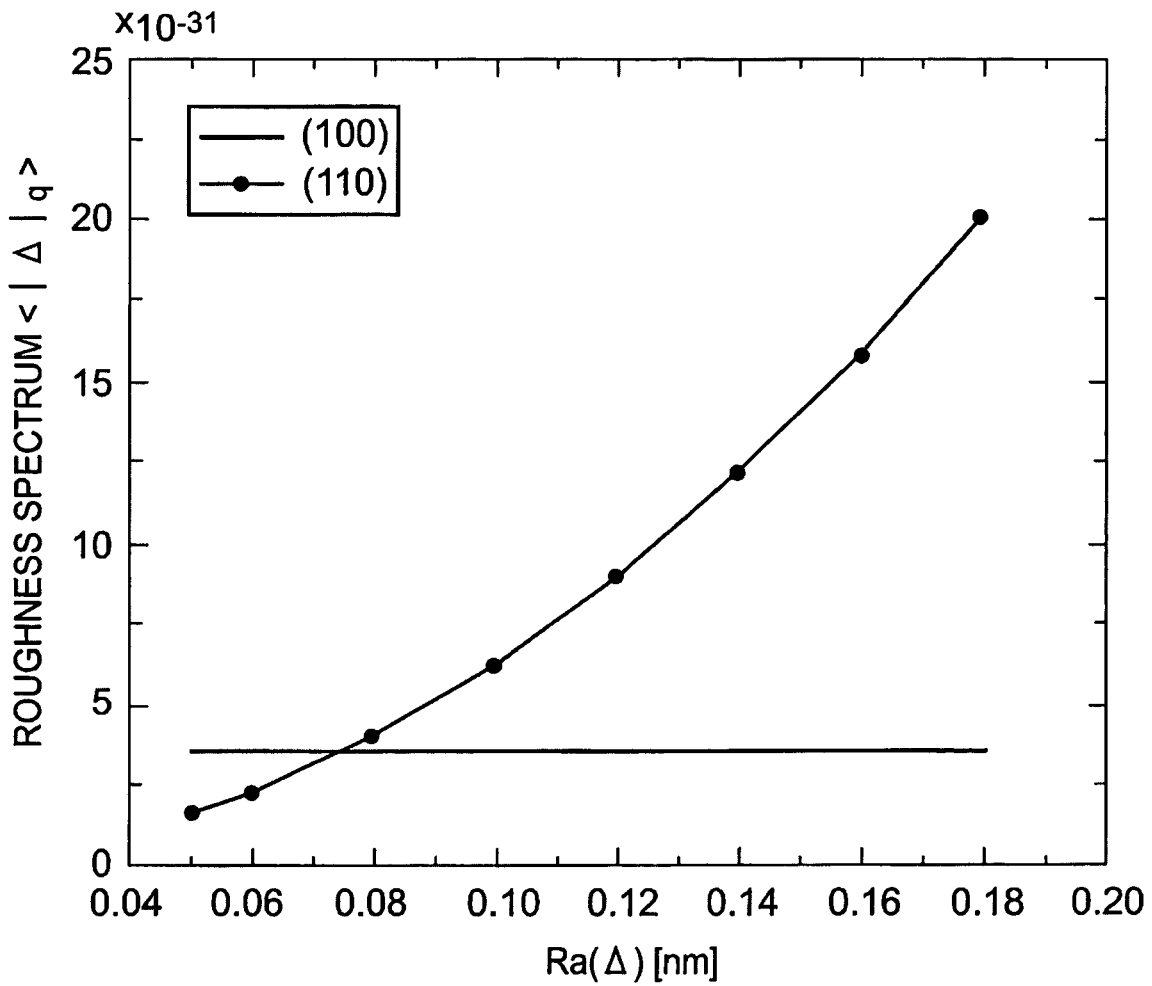
FIG. 2 shows a graphical representation for describing a roughness and a roughness spectrum on a boundary between a semiconductor surface and an insulation film.

According to the report of Kazuo Sato, et al (described in "Sensors and Actuators 73 (1999)" (pages 122 to 130), it is pointed out in FIG. 2 that striae which run in a direction of <-110> appear on a surface configuration when the surface (110) with the crystal plane orientation is subjected to alkaline etching. Surface configurations similar to the plane orientation of (110) also appear on surfaces of plane orientations that are inclined by a range between 0 and 120 in a direction of <110> from (110) and that may be, for example, (551) inclined by 80. Such surface configurations appear on a plane orientation remote from (110) by 11 in a direction <-110>. In addition, it is possible to select crystal plane orientations which show a surface roughness behavior similar to (110) illustrated in FIG. 2.

According to the report of T. Sato et al contributed to Phys. Rev., B4, 1950 (1971), it is possible to know about a plane that has a carrier electron mobility similar to (110) plane. Therefore, when electrons are caused to flow in a direction of <-110>, similar electron mobility behaviors can be obtained even by using planes, such as (331), (221), (332), (111), that are off by an angle between 0 and 35 in a direction <-110>. In addition, behavior similar to (110) plane can be also attained even by using planes, such as (320) plane that are off by an angle between 0 and 120 in a direction <1-10>. Thus, when the above-mentioned planes and their neighboring planes may be selected instead of (110) plane, similar carrier mobility can be obtained.

At any rate, this invention is applicable to the above-enumerated planes and can flatten each surface of the respective planes by forming the self-sacrifice oxide film by isotropic oxidation due to ozone water, hydrogen peroxide solution, or radical oxidation and by removing the self-sacrifice oxide film. It has been confirmed that the resultant silicon surface has a flatness that is as low as Ra=0.05 nm. The above-mentioned technique is short in treatment time and high in productivity. An interface between the silicon surface and the gate insulation film is atomically flat and, therefore, it is possible to improve a carrier mobility and a reliability of the gate insulation film.

Taking the above into account, a method according to this invention will be described with reference to FIG. 15 as a fifth embodiment.

Fifth Embodiment

Figure 15:
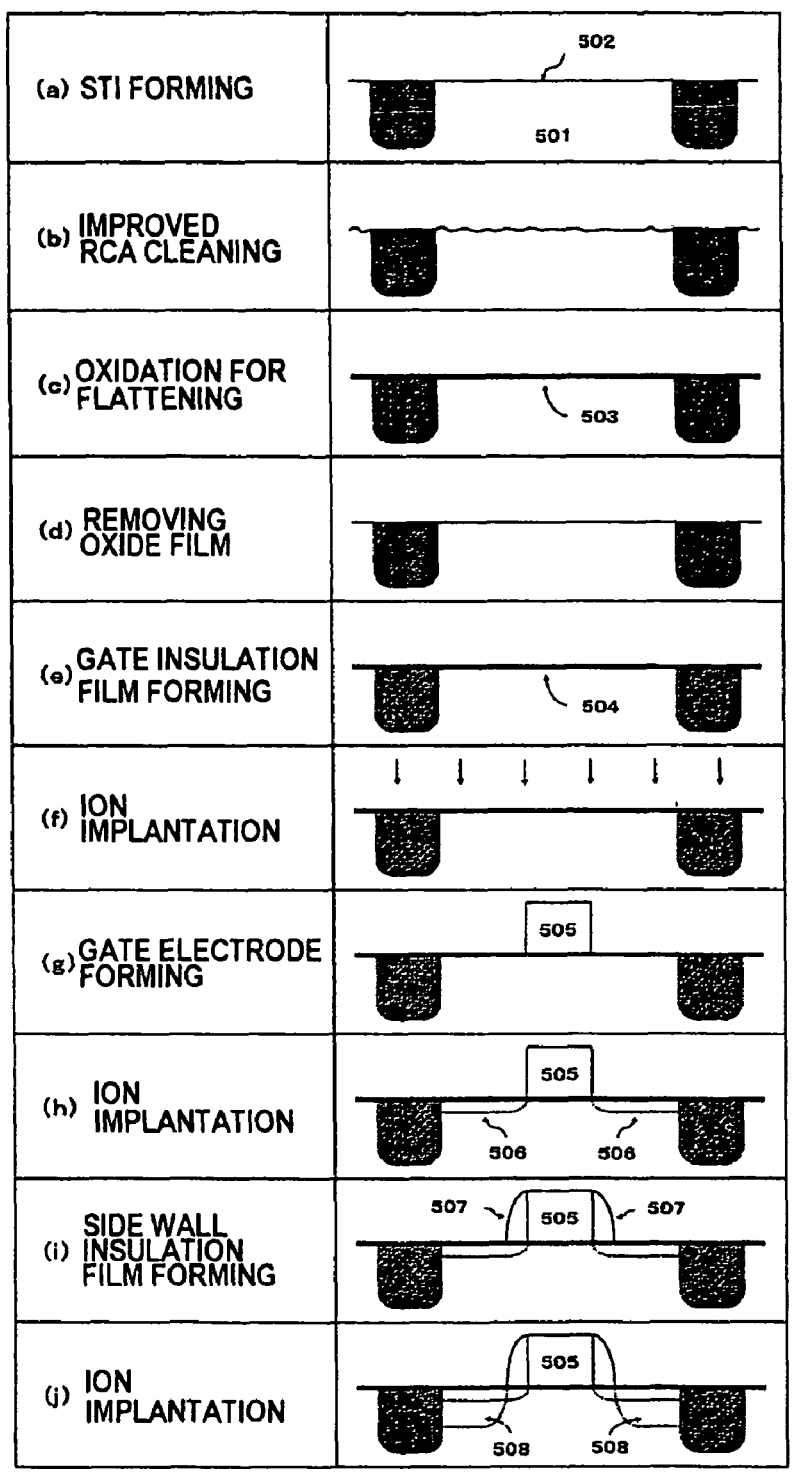
FIG. 15 shows a method of manufacturing a semiconductor device, according to a third embodiment of this invention.

At first, a p-type silicon substance 501 which has a surface of the plane orientation (110) is prepared and is subjected to shallow trench isolation (STI) to define a device isolation region 502 isolated by a trench isolation region, as illustrated in FIG. 15 (a).

The device isolation region 502 is cleaned by RCA cleaning technique so as to remove contamination of organic matters, particles, and metals in FIG. 15 (b). In the illustrated example, SC1 procedure is used as the RCA cleaning. In order to decrease a density of OH, the illustrated SC1 procedure is done by the use of a medical solution in which $NH_4OH:H_2O_2:H_2O$ are mixed with a ratio of 0.05:1:5. As already described before, the SC1 procedure intensely roughens the surface when the defect density, COP density, and the like are high. Therefore, it is preferable that the silicon substance 501 has a remnant oxygen level that is reduced to 5E16/cm3 by hydrogen annealing or argon annealing or a silicon wafer is used which has a silicon epitaxial growth film on the surface. In the illustrated example, the silicon wafer subjected to the silicon epitaxial growth is used and has an arithmetical mean deviation of surface Ra of 0.15 nm, in spite of the fact that the SC1 procedure is done at a low OH density.

Subsequently, a process of flattening the silicon surface of the device region is carried out by dipping the silicon surface into the ozone water to form a self-sacrifice oxide film 503 at a first step, as shown in FIG. 15 (c). Thereafter, the self-sacrifice oxide film 503 is removed at a second step by the use of 0.5% HF solution diluted by hydrogen-added water, as illustrated in FIG. 15 (d). The first and the second steps are repeated five times. The first step is carried out by dipping the silicon surface into the ozone water only for 30 seconds while the second step is carried out for 30 seconds. Only five minutes are needed to repeat the first and the second steps five times. As a result, the arithmetical mean deviation of surface Ra of the silicon surface is reduced to 0.05 nm. From this fact, it is to be noted that the above-mentioned flattening process can be finished within a very short time.

Figure 16:
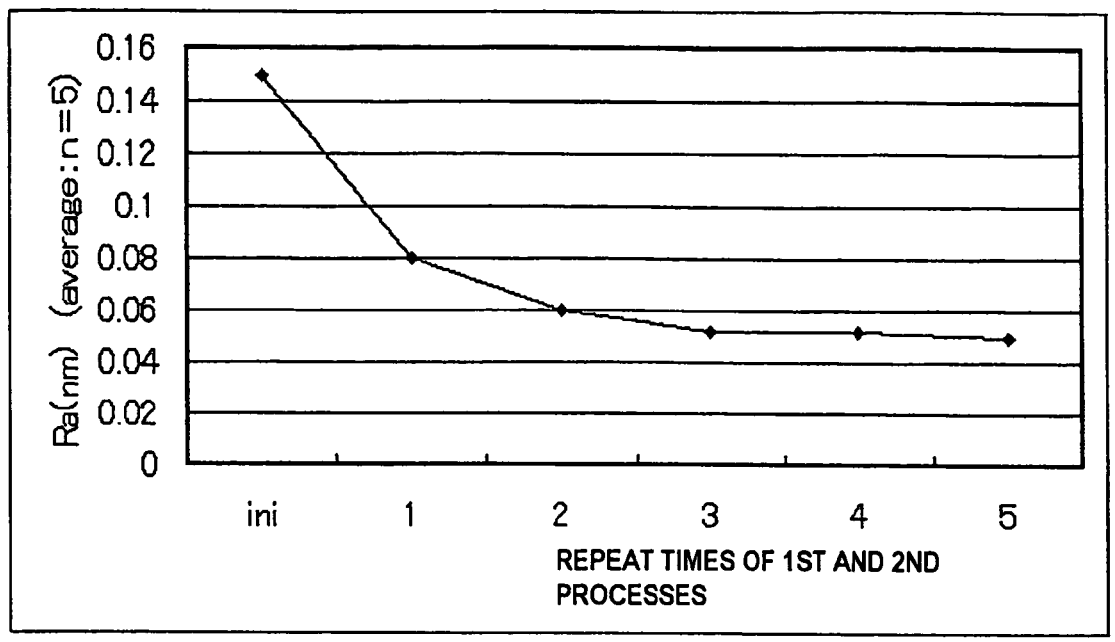
FIG. 16 shows a graphical representation for use in describing a relationship between repeat times of the first and the second processes and the flatness.

Referring to FIG. 16, a relationship between repeat times of the first and the second steps and the flatness has been investigated. In FIG. 16, the abscissa and the ordinate represent the repeat times and the arithmetical mean deviation of surface Ra, respectively. When the repeat times exceed three, Ra is substantially kept unchanged. Therefore, the repeat times are preferably set into an optimum value.

According to the inventors' experiments, it has been found out that the isotropic oxidation can be also achieved by using a mixed solution of sulfuric acid and hydrogen peroxide which may be abbreviated to SPM.

Figure 17:
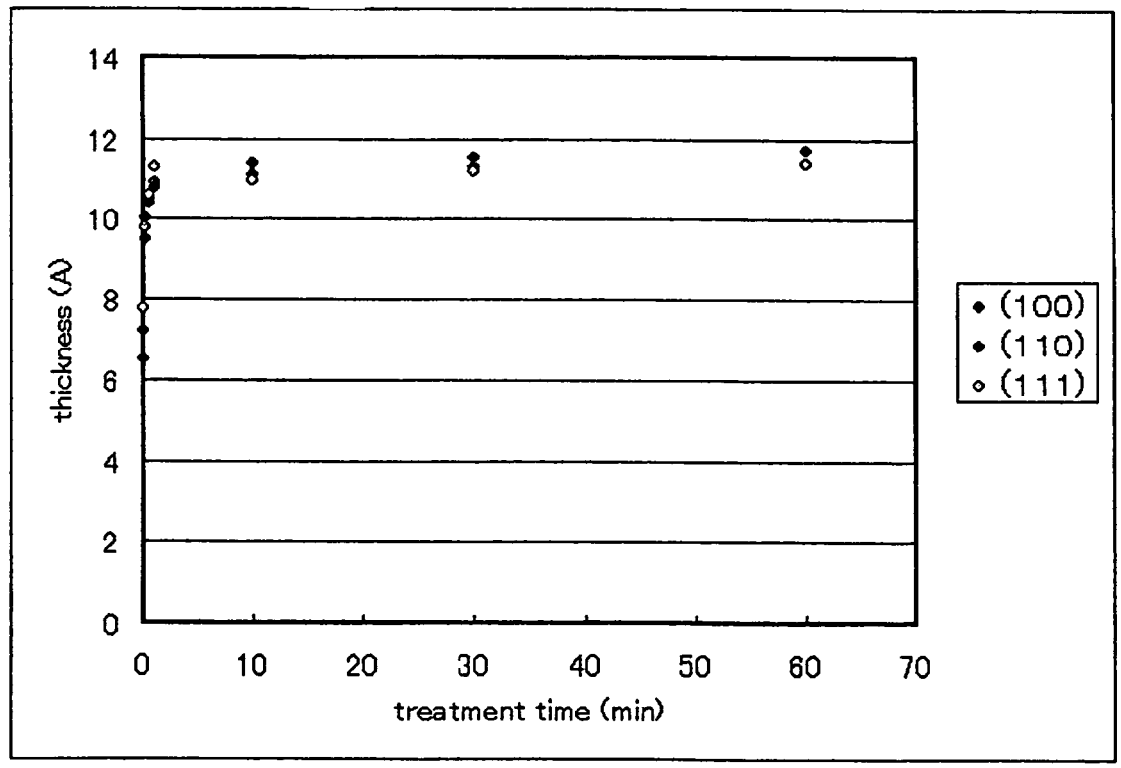
FIG. 17 shows a graphical representation for use in describing a relationship between the treatment time and the thickness.

Referring to FIG. 17, the isotropic oxidation has been made by the use of the sulfuric acid and the hydrogen peroxide mixed at a ratio of 1:4. In FIG. 17, a treatment time of the isotropic oxidation and thickness are taken along the abscissa and the ordinate, respectively. Self-sacrifice oxide films have been formed on (100), (110), and (111) silicon surfaces, like in FIG. 12.

As shown in FIG. 17, the self-sacrifice oxide film has been formed or deposited to a thickness of about 13 angstroms by processing the silicon surface in the SPM for about 30 seconds. Thereafter, the thickness of the self-sacrifice oxide film has been kept substantially unchanged. This shows that the treatment time of forming the self-sacrifice oxide film is as long as 30 seconds and the surface flattening can be achieved within a very short time. Furthermore, the isotropic oxidation makes it possible to realize an apparatus for processing the silicon surface one by one.

Figure 18:
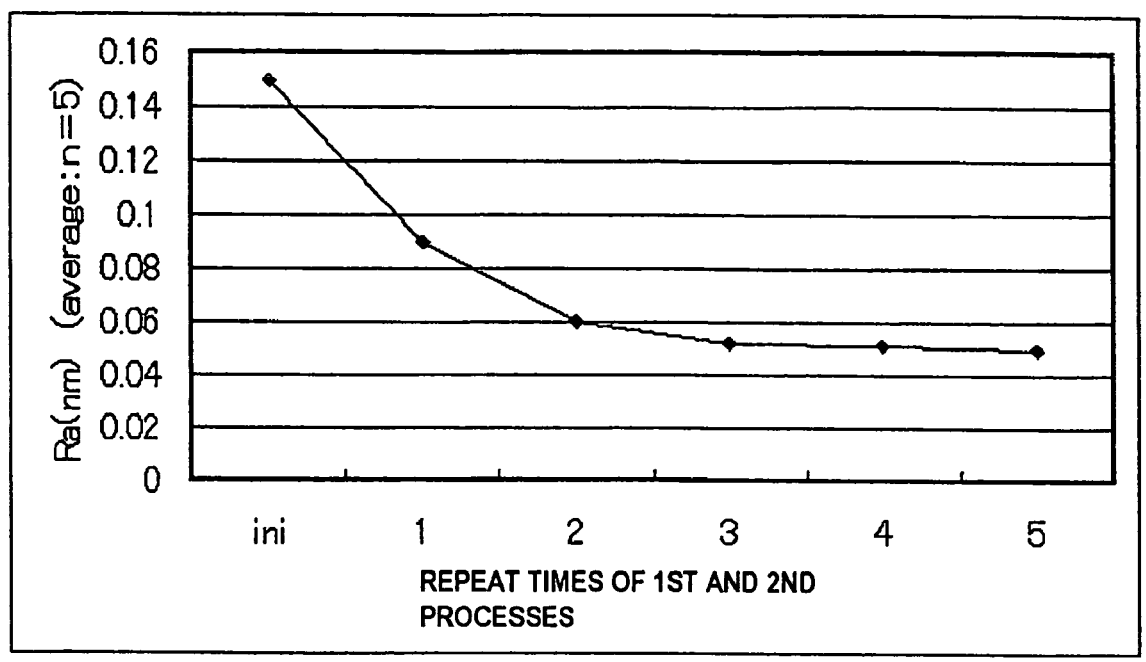
FIG. 18 shows a graphical representation for use in describing a relationship between the repeat times of the first and the second processes and the roughness.

Referring to FIG. 18, a relationship between the repeat times and the flatness is illustrated wherein the first step is carried out by the use of SPM solution while the second step is carried out by the use of 0.5% HF solution diluted. In FIG. 18, the abscissa and the ordinate represent the repeat times and the arithmetical mean deviation of surface (Ra), respectively. Like in FIG. 16, the repeat times are preferably set to an optimum value.

At the second step of removing the self-sacrifice oxide film, a flattening effect would be improved by using a low OH density solution, for example, a mixed solution of HF and HCl because the surface etching due to OH is suppressed. The above-mentioned flattening process based on the isotropic oxidation technique is not only restricted to the plane orientation and the specific semiconductor device but also can be applied to any other processes and devices.

Now, referring back to FIG. 15, the silicon surface of the device region is oxidized to form a gate insulation film ($SiO_2$) 504 to a thickness of 5 nm (FIG. 15 (e)). The above-mentioned $SiO_2$ film may be brought into contact with the silicon surface and may be covered with any other insulation films of, for example, oxide, nitride, oxynitride, silicate.

Next, boron is ion-implanted on a whole surface of the silicon substance 501, as shown in FIG. 15 (f). On the whole surface of the silicon substance 501, a polysilicon film is deposited and patterned into a polysilicon electrode 505 left on the gate insulation film 504 of the device region 502, as illustrated in FIG. 15 (g).

Furthermore, a low density of phosphorus is ion-implanted to form n− source and n− drain regions 506 both of which serve to mitigate a high electric field, as shown in FIG. 15 (h). Thereafter, a silicon oxide film is deposited so as to cover the gate electrode 505 and is removed by anisotropic etching to leave a side wall insulation film 507 on a side wall of the gate electrode 505 (FIG. 15 (i)). Finally, an n-type impurity, such as arsenic, is ion-implanted with a high density to form n+ source and n+ drain regions 508, as shown in FIG. 15 (j).

In the above-description, when cleaning has been carried out through the first through the fifth steps, it is pointed out that the flatness has been improved by reducing dissolved oxygen in $H_2O$, namely, deaerated water. This is because re-oxidation of weak Si—Si bonds can be avoided by a reduction of the dissolved oxygen.

On the other hand, no consideration has thus far been made at all about a relationship between flatness of a silicon surface and surface termination.

In general, it is known in the art that growth of a natural oxide film can be suppressed by terminating the silicon surface by heavy hydrogen, such as deuterium, tritium. According to Japanese Unexamined Patent Publication No. Hei 10-335289 (namely, 335289/1998), it is pointed out that, when the silicon surface is terminated by the heavy hydrogen, such as deuterium, tritium, bonding strength between silicon atoms and the heavy hydrogen is stronger than that between the silicon atoms and hydrogen atoms and, therefore, a good termination effect is accomplished by such a silicon surface terminated by the heavy hydrogen and lasts for a long time.

However, the above-referenced publication teaches only about a termination effect due to the heavy hydrogen but is never directed to the relationship between the surface roughness or flatness and a silicon surface terminated by the heavy hydrogen.

The inventors have found out that the surface termination is closely concerned with the surface roughness. Specifically, when the silicon surface is roughened, a natural oxide film quickly grows on the silicon surface even when the silicon surface is terminated by hydrogen or heavy hydrogen. From this fact, it is understood that, in order to stabilize the surface termination, the silicon surface should be flattened and, otherwise, the natural oxide film is undesirably grown on the silicon surface.

In other words, when the silicon surface is desirably flattened, the surface termination can be stabilized. Moreover, it is possible to evaluate growth of the natural oxide film by monitoring a variation of the surface roughness with time.

In addition, it is to be noted that desirably terminating a silicon surface by hydrogen, deuterium, or tritium is also effective to reduce a surface roughness, as will later be described.

Now, description will be made about a method of processing a silicon surface, according to another embodiment of this invention, taking the above into account. Herein, it should be pointed out that the processing method according to this embodiment also serves to reduce the surface roughness of the silicon surface, especially, (110) silicon surface, like in the other embodiments mentioned before.

The processing method according to this embodiment is similar to the cleaning method in view of the fact that the (110) silicon surface is cleaned through first through fifth steps, like in the fifth embodiment. Specifically, the processing method according to this embodiment has a first step of cleaning the (110) silicon surface by the use of $H_2O$ including ozone. The first step serves to effectively remove contamination of organic matters and to form a chemical oxide film on the (110) silicon surface.

The second step according to this embodiment is carried out by providing a vibration of a frequency of 500 kHz or more in a cleaning solution which includes HF, hydrogen-added $H_2O$ that is deaerated, and surface-active agent. During the second step, the chemical oxide film is removed together with contaminators, such as particles, metals on or in the chemical oxide film. The surface-active agent serves to avoid re-attachment of such contaminators. To the above-mentioned $H_2O$ used in the cleaning solution, deuterium may be added except for the hydrogen. Alternatively, both hydrogen and deuterium may not be added to the $H_2O$ deaerated. At any rate, it is important to suppress an amount of dissolved oxygen in $H_2O$ to 100 ppb or less. Otherwise, the surface roughness is undesirably large, as mentioned before.

The above-mentioned second step is followed by the third step that carries out cleaning by $H_2O$ including ozone, providing a vibration of a frequency of 500 kHz or more. The third step is for removing organic contaminators resulting from the surface-active agent used in the second step and for forming a clean chemical oxide film. The vibration not lower than 500 kHz is provided so as to increase efficiency of removing the contaminators but may not be always provided.

Subsequently, the fourth step is carried out so as to remove the chemical oxide film by the use of a cleaning solution including deaerated and hydrogen-added $H_2O$. The $H_2O$ may also include deuterium or may not include hydrogen and deuterium, if the dissolved oxygen in the $H_2O$ can be reduced, for example, to 100 ppb or less. In any event, the fourth step serves to keep surface flatness of the (110) silicon surface.

Finally, the fifth step serves as a rinse process and is carried out in hydrogen-added $H_2O$ by providing a vibration of a frequency of 500 kHz or more. In this embodiment, the (110) silicon surface is dipped within the above-mentioned $H_2O$ and cleaned. Thus, it is to be noted that the fifth step according to this embodiment rinses the (110) silicon surface in the deaerated and hydrogen-added $H_2O$ and a high frequency vibration is given to the $H_2O$.

According to the inventors' experiments, it has been found out that such a high frequency vibration of the deaerated and hydrogen-added $H_2O$ is very effective to improve a hydrogen termination characteristic and also to lower the arithmetical mean deviation of surface Ra.

To this end, a water drop is dripped on the silicon surface and is left on it in an atmosphere. In this event, it has been confirmed that the water drop is spread with time on the silicon surface in dependency upon the surface roughness of the silicon surface, when the silicon surface is terminated by hydrogen or deuterium. Specifically, when the silicon surface is roughened, the water drop is quickly spread on the silicon surface because the roughened silicon surface has a good hydrophilicity. This shows that the hydrogen terminated on the silicon surface is exchanged by oxygen included in the water drop left in the atmosphere and, as a result, a natural oxide film is grown by the water drop on the silicon surface. On the other hand, when the silicon surface is flat and preferably terminated by hydrogen and/or deuterium, a contour of the water drop is kept unchanged for a long time on the silicon surface. Practically, it is preferable that the concentration of hydrogen or deuterium in $H_2O$ falls within a range between 0.1 and 1.6 ppm and more preferably within a range between 1.2 and 1.4 ppm.

Under the circumstances, it is concluded that the surface roughness can be evaluated by measuring a variation of an angle of a water drop dripped on the silicon surface with time. The angle of the water drop may be a contact angle between the water drop and the silicon surface. In addition, the termination characteristic can be also evaluated by observing the variation of the contact angle.

According to this embodiment, the contact angle of the water drop has been measured before and after the fifth step of rinsing the (110) silicon surface by providing the vibration of 500 kHz or more in order to evaluate the above-mentioned fifth step.

Sixth Embodiment

Figure 19:
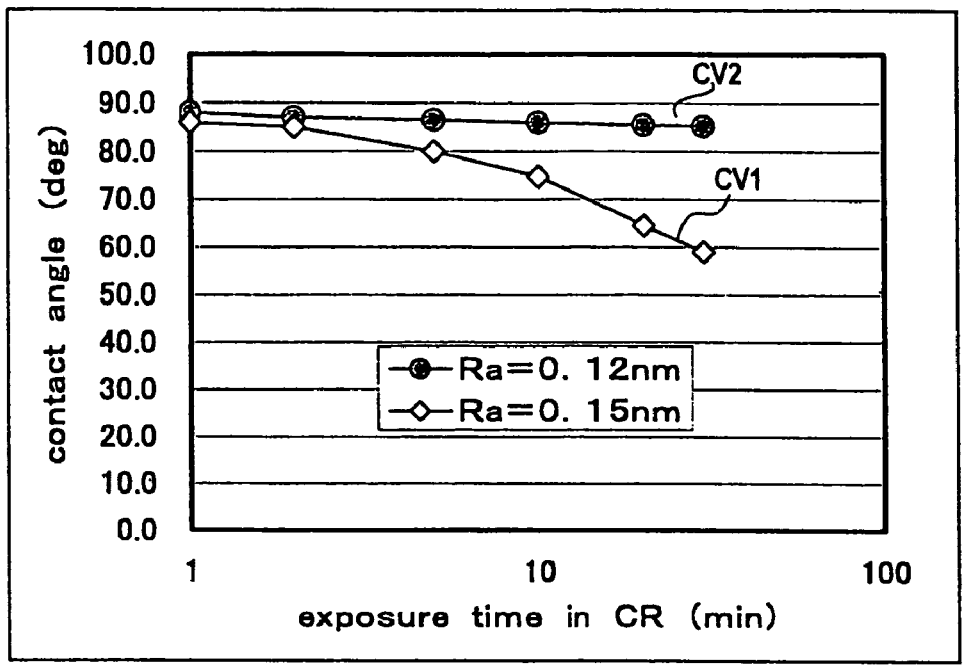
FIG. 19 shows a graphical representation for use in describing a relationship between a degree of oxidation and a contact angle of a water droplet.

Referring to FIG. 19, a relationship between the surface roughness and the surface hydrogen termination characteristic is illustrated. In FIG. 19, the abscissa and the ordinate represent exposure time (minutes) and the contact angle (degrees) measured in a clean room (CR) before and after the fifth step, respectively. The silicon surface is 0.15 nm in arithmetical mean deviation of surface before the fifth step is carried out. In this case, the contact angle is gradually decreased with time, as depicted by a curve CV1 in FIG. 19.

On the other hand, the surface roughness of the silicon surface is reduced to 0.12 nm in arithmetical mean deviation of surface after the fifth step is carried out. As a result, the contact angle of the water drop is kept substantially unchanged with time, as shown by a curve CV2 in FIG. 19. From this fact, it is readily understood that the above-mentioned fifth step brings about both improvement of the flatness (or roughness) and the hydrogen termination.

Figure 20:
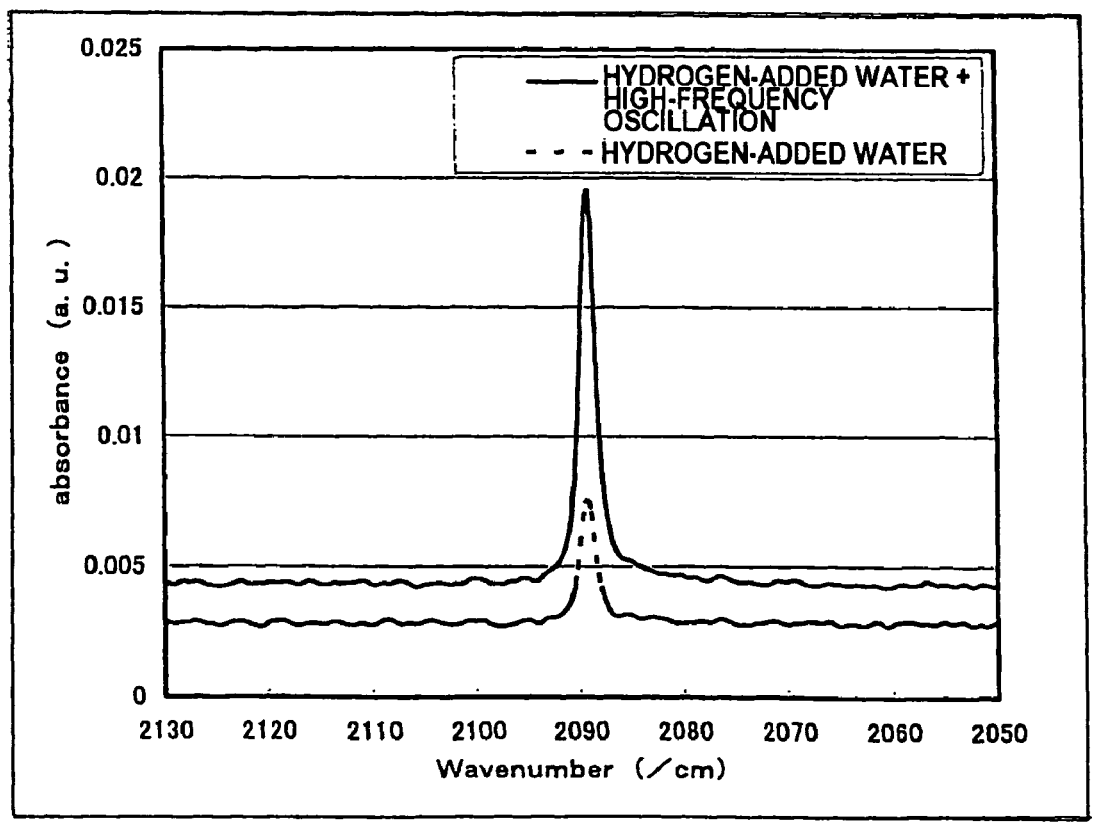
FIG. 20 shows a graphical representation for describing an effect of a vibration.

Referring to FIG. 20, a relationship between absence or presence of a high frequency vibration and status of Si—H bonds has been investigated by FTIR-ATR and its results have been illustrated. In FIG. 20, the result of the hydrogen-added $H_2O$ is depicted by a dotted line peak while the result of using the hydrogen-added $H_2O$ and the high frequency vibration is depicted by a real line peak. From this fact, it is readily understood that the peak of Si—H bonds becomes sharp by providing the high frequency vibration. This is because such a high frequency vibration causes the H radicals to occur in the hydrogen-added $H_2O$ and the H radicals serves to effectively terminate the silicon surface by hydrogen.

In addition, it has been confirmed that using the hydrogen-added $H_2O$ and the high frequency vibration in the fifth step results in the reduction of the surface roughness, as compared with using only the hydrogen-added $H_2O$. Specifically, the arithmetical mean deviation of surface Ra is 0.15 nm when no high frequency vibration is provided while the arithmetical mean deviation of surface Ra is reduced to 0.12 or 0.13 nm by impressing the high frequency vibration. Thus, the fifth step of providing the high frequency vibration is also helpful to reduce the surface roughness. This implies that the H radicals are caused to occur in $H_2O$ due to the high frequency vibration and provide strong hydrogen termination. The strong hydrogen termination serves to effectively prevent the silicon surface from being etched by OH ions in $H_2O$.

In the above-mentioned embodiment, description has been restricted to the fifth step of using the high frequency vibration. However, the above-mentioned technique of using the high frequency vibration and the hydrogen-added $H_2O$ is applicable to the RCA cleaning and processing a silicon surface after removing an oxide film.

The fifth step mentioned above is carried out by providing the high frequency vibration to the deaerated and hydrogen-added $H_2O$ and by immersing the silicon surface within the vibrated $H_2O$. However, such $H_2O$ may be sprayed onto the silicon surface.

Alternatively, the heavy hydrogen, such as deuterium, of 1.2 to 1.4 ppm is added to deaerated $H_2O$ in lieu of hydrogen and a high frequency vibration may be provided to deuterium-added and deaerated $H_2O$. In this event, heavy hydrogen radicals are caused to occur in the deuterium-added $H_2O$ by providing the high frequency vibration and serve to effectively terminate the silicon surface by the deuterium. Preferably, the concentration of the deuterium falls within a range between 0.1 and 1.6 ppm. This method is advantageous in that the deuterium can be readily added to the deaerated $H_2O$ and a specific solution is not needed, differing from Japanese Unexamined Patent Publication No. Hei 10-335289 (namely, 335289/1998). Herein, it is to be noted that the referenced publication needs a specific solution which includes deuterium fluoride or tritium fluoride dissolved in deuterium water or tritiated water.

Under the circumstances, it is readily understood that the method according to this invention is suitable for mass production because no specific solution is needed.

At any rate, the fifth step mentioned above is helpful to rinse and remove impurity, such as F, adhered to the silicon surface on completion of the fourth step.

When the first through the fifth steps were finished with no high frequency vibration provided in the fifth step, the contact angle was measured by dripping a water drop on the silicon surface and was equal to 76.40. However, when the first through the fifth steps were finished with the high frequency vibration provided in the fifth step, the contact angle was equal to 85.00. The results show that the high frequency vibration is effective to remove the impurity from the silicon surface and to terminate the silicon surface by hydrogen or deuterium.

Furthermore, the above-mentioned cleaning process from the first step to the fifth step has been continuously carried out in a nitrogen atmosphere. In addition, a transport process from one step to another step has also been carried out in the nitrogen atmosphere. In other words, the cleaning process has been carried out with the processing medical solutions and semiconductor surface unexposed to the atmosphere. This cleaning process serves to suppress the dissolved oxygen in $H_2O$. Similar results may be accomplished by preventing the medical solutions and the semiconductor surface from being contacted with air or by carrying out the process within heavy hydrogen atmosphere.

After the first through the fifth steps are finished, the silicon surface is dried and thereafter the gate insulation film is formed by oxidizing the silicon surface on the device region within an atmosphere including dry oxygen.

The above description has been described in conjunction with (110) silicon surface alone, this invention may be applied to (551), (311), (221), (553), (335), (112), (113), (115), (117), (331), (221), (332), (111), and (320) silicon surfaces also. Moreover, this invention is also applicable to (100) silicon surface, a polysilicon surface, and an amorphous silicon surface and may be applied to any other semiconductor surface, such as SiGe, SiC, except the silicon surface.

Figure 21B:
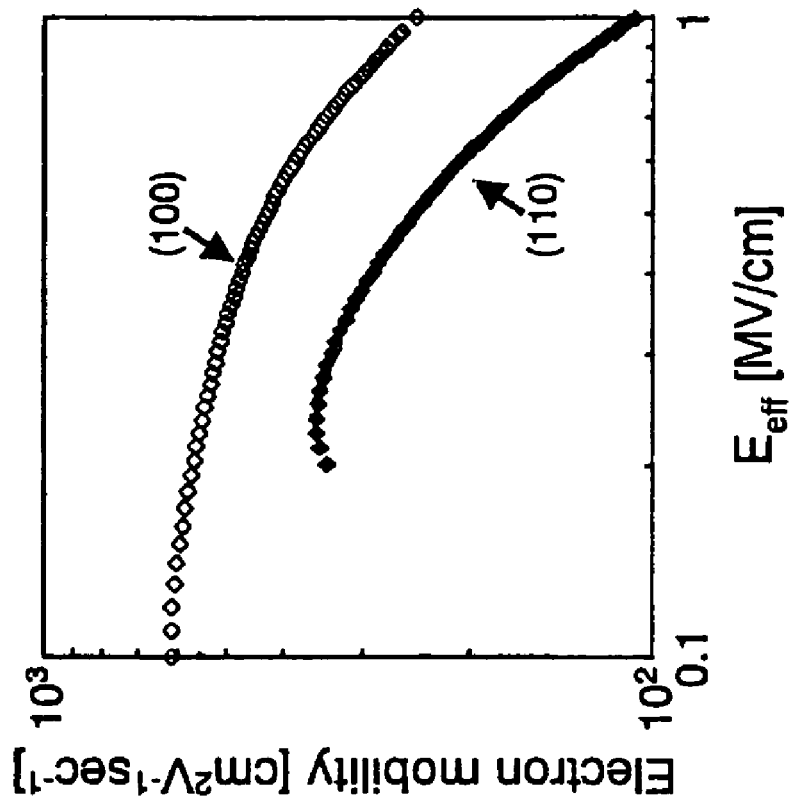
FIGS. 21A and 21B show graphical representations for use in describing hole mobility and electron mobility of p-MOS and n-MOS according to this invention, respectively.
Figure 21A:
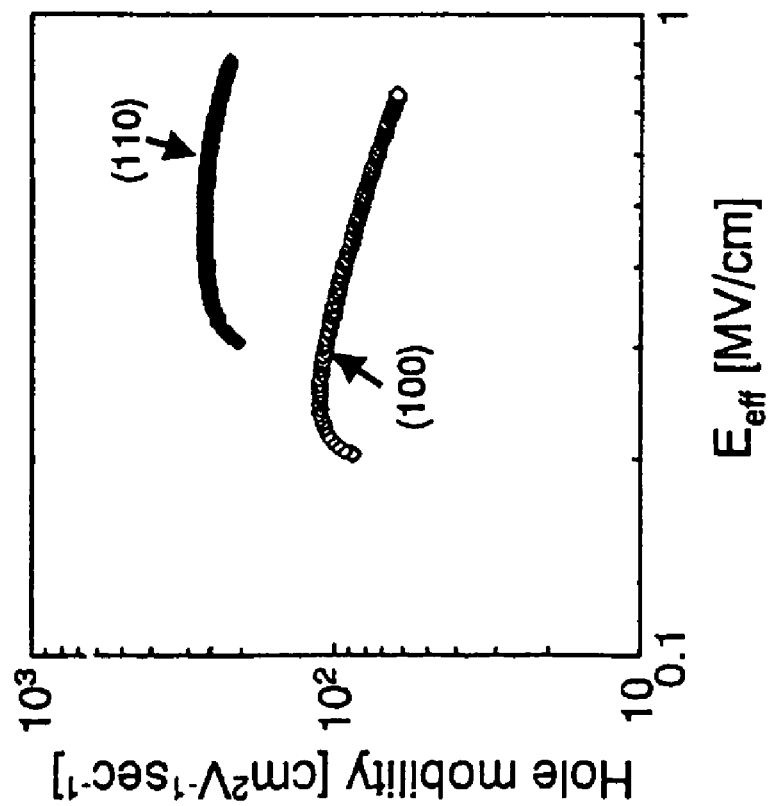

Practically, MOS FET's have been manufactured in the form of p-MOS and n-MOS on (110) silicon surfaces flattened by the use of this invention and have been evaluated in mobility. As well known in the art, the mobility of the p-MOS is specified by hole mobility while the mobility of the n-MOS is specified by electron mobility. In FIG. 21A, the hole mobility of the p-MOS according to this invention is shown by a curve (110) while that of a conventional p-MOS manufactured on a (100) silicon surface is shown by a curve (100). The p-MOS according to this invention has the hole mobility remarkably improved as compared with the conventional p-MOS. Likewise, the electron mobility of the n-MOS according to this invention is illustrated by a curve (110) in FIG. 21B while that of a conventional n-MOS manufactured on the (100) silicon surface is illustrated by a curve (100) in FIG. 21B. The n-MOS according to this invention exhibits the electron mobility improved in comparison with a conventional n-MOS manufactured on a (110) silicon surface that has not been flattened.

At any rate, it has been found out that both of the p-MOS and the n-MOS according to this invention have the hole and the electron mobility improved by about 20% in comparison with the conventional p-MOS and n-MOS which have been manufactured on the non-flattened (110) silicon surfaces, respectively.

Figure 22:
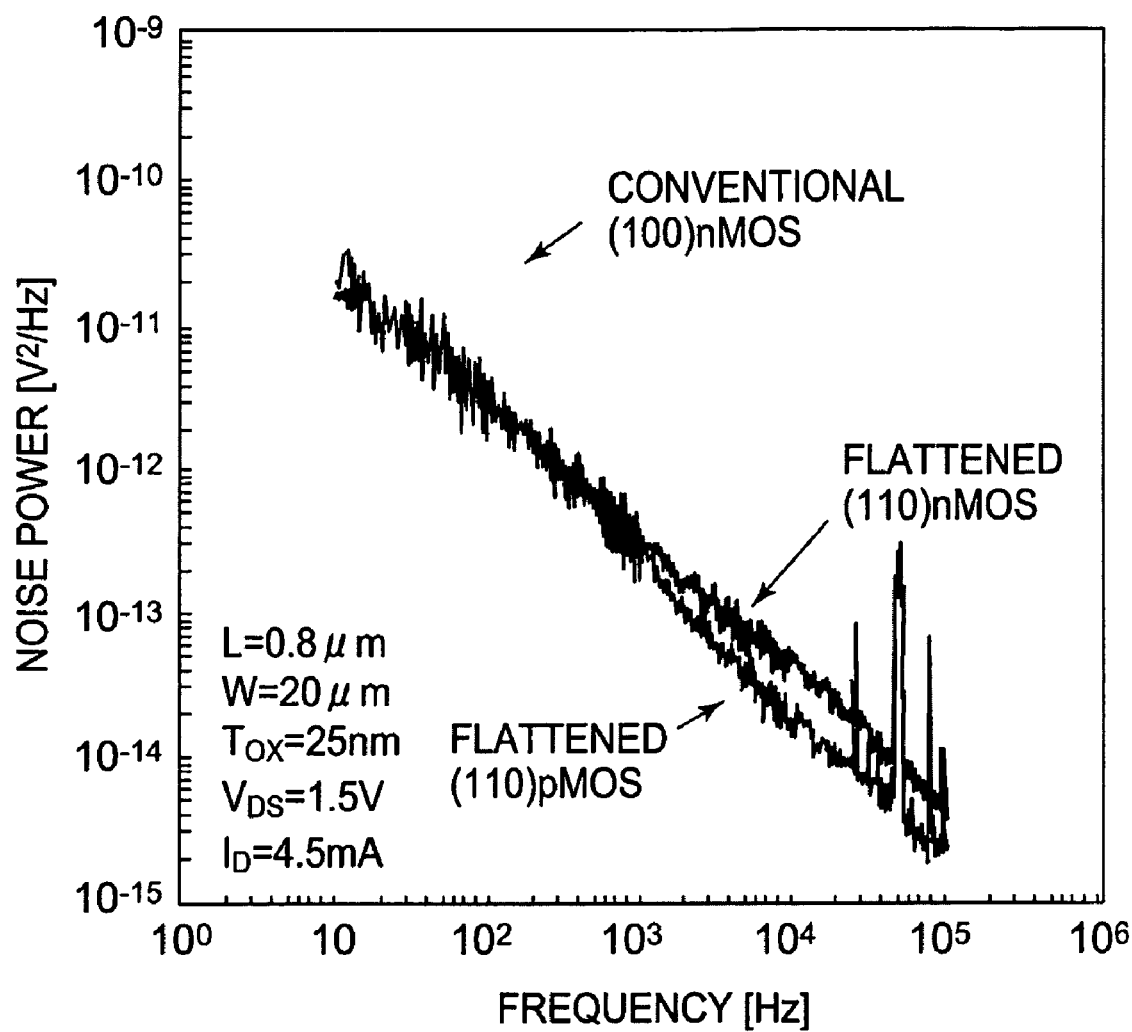
FIG. 22 shows a graphical representation for use in describing a noise characteristic of p-MOS and n-MOS according to this invention.

In FIG. 22, (1/f) noise has been measured in connection with the conventional n-MOS manufactured on the (100) silicon surface and the p-MOS and the n-MOS according to this invention. The p-MOS and the n-MOS have been manufactured on the (110) silicon surfaces flattened in accordance with this invention. As readily understood from FIG. 22, the p-MOS and the n-MOS according to this invention can reduce the (1/f) noise to about a figure down one place as compared with the conventional n-MOS manufactured on the (100) silicon surface.

Although the present invention has been shown and described in conjunction with the preferred embodiments thereof, it should be understood by those skilled in the art that the present invention is not limited to the foregoing description but may be changed and modified in various other manners without departing from the spirit and scope of the present invention as set forth in the appended claims.

What is claimed is:

1. A semiconductor device having a silicon surface with a (551) crystal plane orientation, wherein:
    the silicon surface has a prescribed arithmetical mean deviation of surface Ra that is not greater than 0.15 nm.
2. The semiconductor device of claim 1, wherein the semiconductor device is an N-channel transistor.
3. A semiconductor device comprising a field effect transistor having a source region, a drain region, a channel region, a gate insulation film on the channel region, and a gate electrode on the gate insulation film,
    wherein:
    the channel region is formed at a semiconductor silicon surface which has a (551) crystal plane orientation;
    the silicon surface having a prescribed arithmetical mean deviation of surface Ra that is not greater than 0.15 nm.
4. The semiconductor device of claim 3, wherein the semiconductor device is an N-channel transistor.

* * * * *